US005646050A

United States Patent [19]
Li et al.

[11] Patent Number: 5,646,050
[45] Date of Patent: Jul. 8, 1997

[54] INCREASING STABILIZED PERFORMANCE OF AMORPHOUS SILICON BASED DEVICES PRODUCED BY HIGHLY HYDROGEN DILUTED LOWER TEMPERATURE PLASMA DEPOSITION

[75] Inventors: Yaun-Min Li; Murray S. Bennett, both of Langhorne, Pa.; Liyou Yang, Plainsboro, N.J.

[73] Assignee: Amoco/Enron Solar, Frederick, Md.

[21] Appl. No.: 600,154

[22] Filed: Feb. 9, 1996

Related U.S. Application Data

[63] Continuation of Ser. No. 217,799, Mar. 25, 1994, abandoned.

[51] Int. Cl.⁶ .................................................. H01L 31/20
[52] U.S. Cl. ............... 437/4; 136/258; 257/53; 257/458; 427/575; 427/578; 437/100; 437/101; 437/113
[58] Field of Search ............... 437/4, 100–101, 437/113; 427/575, 578; 136/258 AM; 257/52–55, 458

[56] References Cited

U.S. PATENT DOCUMENTS

| | | | |
|---|---|---|---|
| 4,064,521 | 12/1977 | Carlson | 257/54 |
| 4,109,271 | 8/1978 | Pankove | 257/53 |
| 4,142,195 | 2/1979 | Carlson et al. | 257/54 |
| 4,217,148 | 8/1980 | Carlson | 136/255 |
| 4,317,844 | 3/1982 | Carlson | 437/2 |
| 4,339,470 | 7/1982 | Carlson | 437/4 |
| 4,450,787 | 5/1984 | Weakliem et al. | 118/723 |
| 4,451,538 | 5/1984 | Tanner | 428/447 |
| 4,481,230 | 11/1984 | Hanak | 427/578 |
| 4,776,894 | 10/1988 | Watanabe et al. | 136/249 |
| 4,781,765 | 11/1988 | Watanabe et al. | 136/249 |
| 4,816,082 | 3/1989 | Guha et al. | 136/249 |
| 5,133,986 | 7/1992 | Blum et al. | 427/569 |
| 5,152,833 | 10/1992 | Iwamoto et al. | 106/286.1 |
| 5,206,180 | 4/1993 | Yoshida | 437/4 |
| 5,230,753 | 7/1993 | Wagner | 148/403 |
| 5,242,505 | 9/1993 | Lin et al. | 136/258 |
| 5,248,348 | 9/1993 | Miyachi et al. | 136/258 |
| 5,264,710 | 11/1993 | Yamagishi et al. | 257/2 |
| 5,282,993 | 2/1994 | Karg | 252/63.2 BT |
| 5,358,755 | 10/1994 | Li et al. | 427/577 |

FOREIGN PATENT DOCUMENTS

| 58-53865 | 3/1983 | Japan | 136/258 AM |

*Primary Examiner*—Aaron Weisstuch
*Attorney, Agent, or Firm*—Frank J. Sroka

[57] ABSTRACT

High quality, stable photovoltaic and electronic amorphous silicon devices which effectively resist light-induced degradation and current-induced degradation, are produced by a special plasma deposition process. Powerful, efficient single and multi-junction solar cells with high open circuit voltages and fill factors and with wider bandgaps, can be economically fabricated by the special plasma deposition process. The preferred process includes relatively low temperature, high pressure, glow discharge of silane in the presence of a high concentration of hydrogen gas.

7 Claims, 20 Drawing Sheets

INCREASING STABILIZED PERFORMANCE OF AMORPHOUS SILICON BASED DEVICES PRODUCED BY HIGHLY HYDROGEN DILUTED LOWER TEMPERATURE PLASMA DEPOSITION

This is a continuation of application Ser. No. 08/217,799, filed Mar. 25, 1994, now abandoned.

BACKGROUND OF THE INVENTION

The government of the United States of America may have rights to this invention pursuant to NREL Subcontract No. ZM-0-19033-1 and EPRI Agreement No. RP3505-01.

This invention pertains to photovoltaic and electronic devices fabricated of amorphous silicon and its alloys, and more particularly to a plasma deposition process for enhancing the optical and electrical properties of photovoltaic and electronic devices.

Solar cells and other photovoltaic devices convert solar radiation and other light into usable electrical energy. The energy conversion occurs as the result of the photovoltaic effect. Solar radiation (sunlight) impinging on a photovoltaic device and absorbed by an active region of semi-conductor material, e.g. an intrinsic i-layer of amorphous silicon, generates electron-hole pairs in the active region. The electrons and holes are separated by an electric field of a junction in the photovoltaic device. The separation of the electrons and holes by the junction results in the generation of an electric current and voltage. The electrons flow toward the region of the semiconductor material having an n-type conductivity. The holes flow toward the region of the semiconductor material having a p-type conductivity. Current will flow through an external circuit connecting the n-type region to the p-type region as long as light continues to generate electron-hole pairs in the photovoltaic device.

An amorphous silicon solar cell is comprised of a body of hydrogenated amorphous silicon (a-Si:H) material, which can be formed in a glow discharge of silane. Such cells can be of the type described in U.S. Pat. No. 4,064,521 entitled "Semiconductor Device Having A Body Of Amorphous Silicon" which, issued to David E. Carlson on Dec. 20, 1977. Within the body of the cell there is an electric field which results from the different conductivity types of the semiconductor regions comprising the body.

Amorphous silicon solar cells are often fabricated by the glow discharge of silane ($SiH_4$). The process of glow discharge involves the discharge of energy through a gas at relatively low pressure and high temperature in a partially evacuated chamber. A typical process for fabricating an amorphous silicon solar cell comprises placing a substrate on a heated element within a vacuum chamber. A screen electrode, or grid, is connected to one terminal of a power supply, and a second electrode is connected to the other terminal of the power supply such that the substrate is between the second electrode and the screen electrode. While silane, at low pressure, is admitted into the vacuum chamber, a glow discharge is established between the two electrodes and an amorphous silicon film deposits upon the substrate.

Amorphous silicon can be doped by adding impurities to the silane. For example, the first dopant may be diborane ($B_2H_6$), which is added to the silane to form a p-type amorphous silicon layer. After the p-type layer has been formed to a thickness on the order of 100 Angstroms (Å), the diborane flow is stopped to form an intrinsic region having a thickness on the order of a few 1000 Angstroms. Thereafter, an n-type dopant, such as phosphine ($PH_3$), is added to the silane flow in order to form an n-type amorphous silicon layer having a thickness of a few 100 Angstroms. On the n-type layer, a transparent, conductive layer is formed. Usually zinc oxide (ZnO) is used to form the transparent conductive layer.

Single-junction amorphous silicon solar cells can be formed with a p-i-n structure or an n-i-p structure. The substrate of the solar cell can be made of glass or a metal, such as aluminum, niobium, titanium, chromium, iron, bismuth, antimony or steel. If a glass substrate is used, a transparent, conductive coating, such as tin oxide ($SnO_2$) can be applied to the glass substrate prior to forming the amorphous silicon. A metallic contact can be formed on the back of the substrate.

Current output of a photovoltaic device is maximized by increasing the total number of photons of differing energy and wavelength which are absorbed by the semiconductor material. The solar spectrum roughly spans the region of wavelength from about 300 nanometers to about 2200 nanometers, which corresponds to from about 4.2 eV to about 0.59 eV, respectively. The portion of the solar spectrum which is absorbed by the photovoltaic device is determined by the size of the bandgap energy of the semiconductor material. Crystalline silicon (c-Si) has a bandgap energy of about 1.1 eV. Solar radiation (sunlight) having an energy less than the bandgap energy is not absorbed by the semiconductor material and, therefore, does not contribute to the generation of electricity (current and voltage) of the photovoltaic device.

Amorphous silicon solar cells were first constructed two decades ago. The first generation of solar cell devices suffered from low efficiency as well as from photodegradation, a phenomenon now known as the Staebler-Wronski effect. Over the years, there have been many improvements in both initial performance and stability, so that presently, conventional large area multi-junction modules composed of many monolithically connected cells exhibit stabilized performance below 9%.

The first cells were Schottky barrier devices and had an open circuit voltage ($V_{oc}$) of about 0.55V. A series of improvements in the structure of solar cells, including first the use of p-i-n homojunctions and subsequently p-SiC/i,n-Si heterojunctions brought substantial improvements in the open circuit voltage ($V_{oc}$). Further improvement resulted from the insertion of a thin i-SiC layer between the p-SiC layer and the i-layer. Increases in $V_{oc}$ can be realized by improvements of the transparent conductor, by use of improved p-layers by improvements in the p-i interface layer, by incorporating higher bandgap i-layers into the cell. The last two techniques, improving the p-i interface and widening the gap of the intrinsic layer by using SiC alloys or varying the i-layer deposition conditions can, however, result in material which has lower resistance to photodegradation. The exact details of the deposition process and device structure are very important.

The performance of hydrogenated amorphous silicon (a-Si:H)based solar cells degrades upon light exposure. Deterioration of electronic properties of the intrinsic a-Si:H layer in the p-i-n solar cell is believed to be responsible for most of the degradation in device performance. The a-Si:H i-layer has been traditionally deposited from a glow discharge of pure silane at a substrate temperature around 250° C. For devices made under such conditions, the efficiency of the solar cell degrades linearly with the logarithm of light exposure time until approximately 10,000 hours of light soaking at 100 mW/cm² intensity and then saturates beyond this time frame.

A characteristic of single-junction silicon cells made by conventional procedures (without hydrogen dilution) is its loss (degradation) over time of conversion efficiency, i.e. efficiency of the solar cell in converting sunlight to electricity. Efficiency plotted versus the log of time provided a straight line which was observed in some cases to extend to at least 10,000 hours. With few exceptions, the efficiency was observed to continue to decay as time went on with no deviation from the straight line dependence. The slope of the straight line was principally a function of the i-layer thickness. A good rule of thumb is that the loss of efficiency per decade of time, is the i-layer thickness in angstroms divided by 300. As an example, a 4000 Å thick cell would lose 4000/300=13%/decade. It was found that proper design of the p-i interface layer could improve initial efficiency without affecting the slope of this line. However, if the interface layer design was not correct, the slope of the efficiency-log time curve would increase. Going to lower deposition temperatures without hydrogen dilution, would substantially increase the slope of the line. At low deposition rates, e.g. from 4–10 Å/sec, the degradation rate is unaffected by deposition rate. However, at high rates the degradation rate increases.

The degradation rate of a multi-junction cell is about the average of the rates of the component cells comprising it. As an example, a single-junction amorphous silicon cell with a 4000 Å thick i-layer formed at high temperatures and no hydrogen dilution, might lose 40% of its initial efficiency in 1000 hours of light soaking. A Si/Si tandem having the same total thickness of i-layer (front i-layer 700 Å, back i-layer 3300 Å) would lose only about 20% (front i-layer loss about 7%, back i-layer about 33%).

Stability is a characteristic of how a solar cell's efficiency (performance) will change or degrade under continuous or pulsed solar illumination. One of the biggest challenges in a-Si:H photovoltaic (PV) technology has been the instability problem. Conventional prior art hydrogenated amorphous silicon (a-Si:H) solar cells can degrade greatly with light soaking, particularly for cells with thick i-layers. It is well known in the photovoltaic industry that the addition of even a small amount of carbon to amorphous silicon (a-Si:H) will make the solar cell very unstable, even for thin cells with less than 1000 Å i-layer thickness. Previously deposited amorphous silicon carbon (a-SiC:H) solar cells using conventional prior art techniques often experienced greater than 70% degradation in efficiency after a few hundred hours of simulated solar irradiation.

In the past, amorphous silicon and its alloys were deposited by glow discharge with a small amount of hydrogen dilution at a temperature of at least 250° C. and a pressure less than 0.5 Torr. Typifying this conventional glow discharge process and other processes are those described in U.S. Patent Nos. 4,064,521;4,109,271;4,142,195; 4,217, 148;4,317,844;4,339,470;4,450,787;4,481,230;4,451,538;4, 776;894;and 4,816,082. These conventional prior art processes have met with varying degrees of success. Previously, those skilled in photovoltaic and amorphous silicon deposition arts generally believed that low temperature deposition can produce only inferior products with poor stability and low quality.

It is, therefore, desirable to provide an improved process to produce amorphous silicon devices having improved properties.

SUMMARY OF THE INVENTION

An improved process is provided to fabricate electronic devices and, particularly, solar cells for use in solar modules. Advantageously, the novel process, unexpectedly and surprisingly, greatly improves the stability, conversion efficiency, fill factor (FF), and open circuit voltage ($V_{oc}$) of amorphous silicon-based solar cells. Powerful single and multi-junction amorphous silicon-based solar cells can be produced with a fill factor greater than 0.7, an open circuit voltage greater than 0.9V, preferably greater than 1.0V, and with wider optical bandgaps. Significantly, portions of the active intrinsic i-layer of solar cells produced by this unique process, completely saturate from light soaking, e.g. in 100–1500 hours of direct sunlight, to substantially prevent further photodegradation (light degradation) of the solar cell. Desirably, the process is economical, efficient, and effective. In the novel process, an active intrinsic i-layer or region, p-i interface, or i-n interface of amorphous silicon or its alloys is deposited at low deposition temperatures and high deposition temperatures by plasma enhanced chemical vapor deposition (CVD) of silane or another deposition gas (feedstock) highly diluted with a diluent gas, such as hydrogen ($H_2$) and/or deuterium ($D_2$). Desirably, the deposition temperature (Ts) of the substrate is substantially less than 250° C., and preferably less than 220° C. and substantially greater than 80° C., for best results. The deposition pressure can be substantially greater than 0.5–1.0Torr and less than 50 Torr, and is preferably greater than 2 Torr and less than 20 Torr, for best results.

The plasma deposition can be by cathodic direct current (DC) glow discharge, anodic DC glow discharge, radio frequency (RF) glow discharge, very high frequency (VHF) glow discharge, microwave deposition (microwave glow discharge), or alternating current (AC) glow discharge in general. The amorphous silicon-based region can comprise hydrogenated amorphous silicon, hydrogenated amorphous silicon carbon, or hydrogenated amorphous silicon germanium. Preferably, at least one junction is operatively connected to the amorphous silicon layer of the semiconductor device or solar cell. The junction can be: a semiconductor junction, a triple junction, double junction or other multi-junction, as well as a tandem junction, heterojunction, rectifying junction, tunnel junction, or a barrier junction comprising a Schottky barrier. Solar cells with a p-i-n or n-i-p junction can be produced by the novel process.

Desirably, diluent gas flow rates and dilution ratios are high for best results. The dilution ratio of the concentration of diluent (hydrogen and/or deuterium) to silane ($SiH_4$) or some other deposition gas (feedstock), preferably is at least 10:1, can be substantially greater than 100:1, as high as 10,000:1, preferably less than 1000:1, and most preferably less than 300:1 for RF deposition and less than 200:1 for DC deposition. Silane ($SiH_4$) is the preferred deposition gas for amorphous silicon solar cells and semiconductors. In some circumstances, it may be desirable to use other deposition gases (feedstocks) instead of or in combination with silane, such as: ($Si_2H_6$), tetramethylsilane [$Si(CH_3)_4$], $SiF_4$, $SiHF_3$, $Si_2H_2Cl_4$, and other deposition gasses having the general formula $Si_NH_{2N+2-M}Y_M$ where:

Si=silicon
H=hydrogen or deuterium
Y=halogen [fluorine (F), chlorine (Cl), bromine (Br), Iodine (I), etc.]
N=positive integer (whole number) $\geq 1$
M=positive integer; and
$2N+2-M \geq 0$ Silane ($SiH_4$) and methane ($CH_4$) are the preferred deposition gases for amorphous silicon carbon solar cells and semiconductors. Other deposition gases (feedstocks) can be used in lieu of or in combination with silane and/or methane, such as: methylsilane or silylmethane ($CH_3SiH_3$), trisilyl-methane [$CH(SiH_3)_3$], and other deposition gases having the general formula $CH_N(SiH_3)_{4-N}$ where N is an integer in the range of 0 to 4, as well as other hydrocarbon deposition gases, e.g. acetylene ($C_2H_2$), ethylene/ethene ($C_2H_4$), ethane ($C_2H_6$), propane ($C_3H_8$), butane ($C_4H_{10}$), and/or halocarbon (halogen-carbon) gases, e.g. $CF_4$, $CDCl_3$. Significantly, the inventive process improves the stability of devices comprising amorphous silicon. As described above, the inventive process includes fabricating at least a portion of the amorphous silicon-based material by a low-temperature, high-pressure chemical vapor deposition (CVD) in the presence of hydrogen. Such CVD can include: DC, AC, RF, and microwave deposition.

Advantageously, the inventive process is particularly useful for photovoltaic equipment to decrease light-induced degradation in solar cells, solar modules, solar panels, solar roofs, architectural windows, and glass panes having a reflective coating of amorphous silicon. The inventive process is also useful to decrease current-induced (injected) degradation in electronic devices, such as: thin-film field-effect transistors (TFT), semiconductors, diodes, televisions, computer displays, matrix addressed arrays, image sensor arrays, active matrix liquid crystal displays (LCD), medical x-ray imaging devices, photoreceptors, photocopiers, optical scanners, facsimile machines, laser printers, optical sensors, and photodetectors.

Desirably, in the inventive process, light-induced degradation of a solar cell is substantially prevented after reaching a saturation level, such as after 100 to 1,000–1,500 hours, preferably after 100–500 hours, of exposure to natural or simulated sunlight (light soaking) of the solar cell. This is accomplished by depositing an amorphous silicon region, such as an intrinsic layer or a p-i interface, in the solar cell by glow discharge at a sufficient temperature and pressure to cause saturation of light-induced degradation of the cell after a saturation time of exposure to natural or simulated sunlight, such as 100–1,500 hours, preferably after 100–500 hours. Desirably, single-junction solar cells with amorphous silicon regions degrade substantially less than 15%, preferably less than 10%, most preferably about 7.5% or less, per 1,000 angstroms thickness, before the saturation time. Single-junction solar cells with amorphous silicon carbon regions degrade substantially less than 55%, preferably from 5% to 30%, per 1,500 angstroms thickness, before the saturation time.

DC glow discharge can be accomplished at a temperature ranging from 80°–210° C., at a pressure ranging from 0.1–10 Torr, with a dilution ratio of diluent to the feedstock (deposition gas) ranging from 10:1 to 200:1. RF glow discharge can be accomplished at: a temperature ranging from 80°–220° C. at a pressure ranging from 1–50 Torr, preferably 2–20 Torr, and a dilution ratio of less than 1,000:1, preferably ranging from 10:1 to 400:1, and most preferably from 20:1 to 200:1.

The novel process is particularly useful to produce a solar cell with an open circuit voltage ($V_{oc}$) greater than 0.9 volt and a fill factor (FF) greater than 0.7. Solar cells having an active region comprising amorphous silicon or amorphous silicon carbon have been produced with an open circuit voltage greater than one volt for a single junction cell and a conversion efficiency remarkably greater than 11% for multi-junction cells with the inventive process with RF and DC glow discharge.

It was unexpectedly and surprisingly found that stability is a function of hydrogen dilution and the deposition temperature. Significantly increasing the dilution ratio of the diluent gas (e.g. hydrogen) to the deposition gas (e.g. silane) up to a threshold value at a given deposition temperature greatly improves the stability of solar cells by substantially minimizing and preventing light-induced degradation of the solar cell after a saturation period of light soaking, preferably less than 1,000–1,500 hours, and most preferably from 100–200 hours. The threshold value of the dilution ratio is about 10:1 at a deposition temperature of about 210° C. The threshold value of the dilution ratio is about 30:1 at a deposition temperature of about 150° C. Stability of the solar cells can be further enhanced by keeping the deposition pressure and the plasma deposition power relatively low, as well as by decreasing the growth rate of the active layer.

The invention also includes solar cells produced by any of the above techniques and process steps. The preferred solar cell has a rapidly light-saturable amorphous silicon-containing region which substantially prevents light-induced degradation of the solar cell after the solar cell has been exposed to natural or simulated sunlight (light soaking) for the period of time discussed above, i.e. less than 1,000–1,500 hours, preferably 100–500 hours. The solar cell can comprise a light-soaked saturated region. In the preferred form, the solar cell has a high-voltage region with an open-circuit voltage ($V_{oc}$) greater than 0.9 volt, most preferably greater than one volt, and a fill factor (FF) greater than 0.7. The high-voltage region preferably has a conversion efficiency greater than 9%, most preferably greater than 11%. The region can be an active intrinsic Mayer, an i-n interface, or a p-i interface. The silicon-containing region preferably comprises hydrogenated amorphous silicon or hydrogenated amorphous silicon carbon, although in some circumstances it may be desirable to use hydrogenated amorphous silicon germanium.

A more detailed explanation of the invention is provided in the following description and appended claims taken in conjunction with the accompanying drawings.

DETAILED DESCRIPTION OF THE PREFERRED EMBODIMENT

Device Physics

Figure 1:
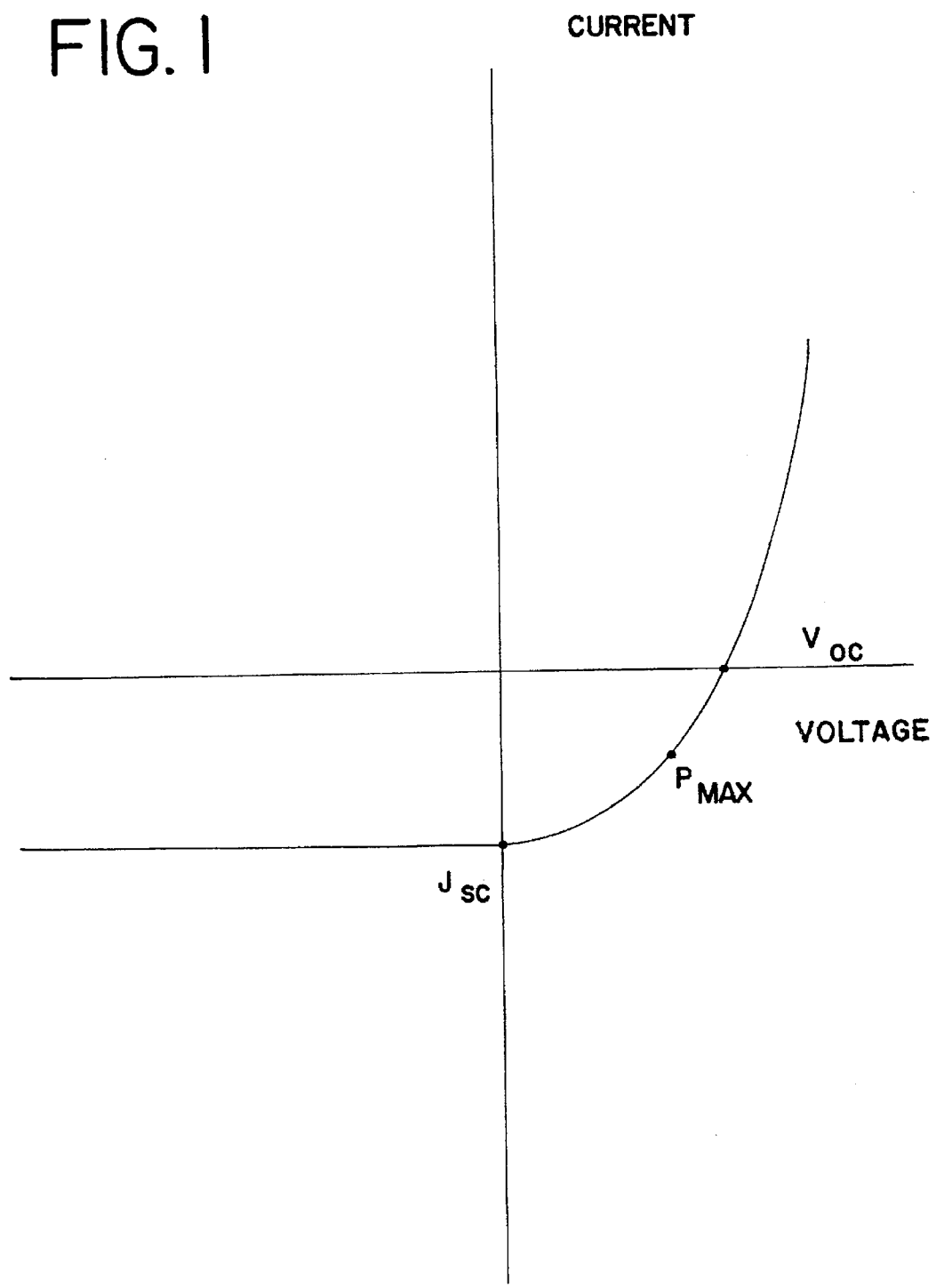
FIG. 1 is a graph of the output of a solar cell.

Single-junction devices comprise three layers. These are p- and n-layers which are extrinsic or doped and an i-layer which is intrinsic or undoped (at least containing no intentional doping). The i-layer is much thicker than the doped layers. This is because mainly light absorbed in the i-layer is converted to electrical power which can be used in an external circuit. The thickness of the Mayer (sometimes called the absorber layer) determines how much light is absorbed. When a photon of light is absorbed in the i-layer it gives rise to a unit of electrical current (an electron-hole pair). However, this electrical current will go nowhere on its own. Hence, the p- and n-layers. These layers, which contain charged dopant ions, set up a strong electric field across the i-layer. It is this electric field which draws the electric charge out of the i-layer and sends it through an external circuit where it can do work (i.e. power a light bulb).

A typical p-i-n single-junction solar cell is shown in Table 1.

As shown in Table 1, a single-junction solar cell can have a substrate made of metal and preferably glass. A front contact comprising a transparent conducting metal oxide (TCO), such as tin oxide, can be deposited on the substrate. A p-i-n junction is sandwiched between the front contact and a back (rear) contact, made of metal, such as aluminum or silver. The p-i-n junction includes: (1) a layer of amorphous silicon-based semiconductor material doped with a p-type dopant such as diborane ($B_2H_6$) to form a p-layer; (2) an undoped layer of amorphous silicon-based semiconductor material that forms an active intrinsic i-layer; and (3) a layer of amorphous silicon-based semiconductor material doped with an n-type dopant, such as phosphine ($PH_3$) to form an n-layer. The n-type doped layer can form a rectifying junction with the i-layer and can form ohmic contact with the rear contact. Light incident on the glass substrate passes through the substrate, the front contact, and the p-i-n junction. The light can be reflected by the rear contact back to the p-i-n junction.

Solar cells can be single junction or multi-junction cells. A multi-junction or tandem cell is simply a stack of single junction p-i-n cells. There are two advantages to tandem cells; the first is light absorption. The different amorphous alloys absorb different parts of the solar spectrum. Amorphous silicon carbon (a-SiC) absorbs ultraviolet (UV) light efficiently while passing most visible and all infrared light. Amorphous silicon (a-Si) absorbs UV light (but not as efficiently as a-SiC), absorbs visible light efficiently, but does not absorb much infrared (IR) light. Amorphous silicon germanium (a-SiGe) absorbs IR efficiently and UV and visible light generally inefficiently.

One benefit of tandem solar cells is that each layer (junction) can have a different absorbing layer, so that virtually all wavelengths of light can be absorbed efficiently. A second benefit of tandem cells is that because the absorbing layers are tailored to the solar spectrum and absorb light efficiently, they can be thinner. Thinner layers are more stable with respect to the Staebler-Wronski effect. Therefore, tandem solar cells are intrinsically more stable than single-junction photovoltaic devices with the same light absorbing capabilities.

TABLE 1

Single-Junction Solar Cell

| Component | Material | Thickness | | |
|---|---|---|---|---|
| | | broadest | intermediate | preferred |
| Substrate | Glass | | | |
| Conducting oxide | Usually ZnO or SnO$_2$. In some circumstances it may be desirable to use another transparent conductor | | | <20000Å |
| p-layer | p-doped SiC | | <150Å | <100Å |
| p-i interface layer | i-SiC, sometimes graded to i-Si | 2000Å | <250Å | <100Å |
| i-layer | i-Si | <10000Å | 500–7500Å | 2500–4500Å |
| n-layer | n-Si | | <400Å | <150Å |
| rear contact | a metal, usually Al or Ag. Often a transparent oxide. Indium tin oxide or ZnO can be inserted between the n-layer and the metal layer. | | | <3000Å |

The p-i interface layer might be a-SiC containing perhaps 5% carbon at the edge of the p-layer. The composition is then linearly graded until it contains no carbon at the i-layer edge. However, there are many ways to make the p-i interface layer, not all of which involve using grading or even carbon.

Tandem solar cells can have layers of hydrogenated amorphous silicon separated by a tunnel junction and arranged in a stacked configuration. The thickness of the layers can be adjusted to maximize efficiency and equalize the current generated in each layer. The tandem solar cells can have the bandgap of the amorphous silicon layers varied by adjusting the hydrogen concentration in the amorphous silicon layers.

Some typical multi-junction solar cells are shown in Tables 2–4.

mercial simulator can be used. The second standard test is called the quantum efficiency measurement and provides information on the ability of the cell to use light of different wavelengths. The properties of amorphous silicon, and hence a-Si based solar cells, degrade with exposure to light.

TABLE 2

Three-Junction (Si/Si/SiGe) Tandem Solar Cell

| Component | Material | Thickness broadest | preferred |
|---|---|---|---|
| Substrate | Glass | | |
| transparent oxide | same as Table 1 | | |
| p-layer | same as Table 1 | | |
| $i_1$ - first intrinsic layer | i-Si | 100–2000Å | 2500–4500Å |
| first recombination junction | comprises the n-layer from the first junction and the p-layer from the second. However n- and/or p-layers may be microcrystalline. There may be additional layers introduced as well. | <500Å | <300Å |
| $i_2$ - second intrinsic layer | i-Si | 900–10000Å | 2000–5000Å |
| second recombination junction | see above | | |
| $i_3$ - third intrinsic layer | i-SiGe | 500–5000Å | 1200–4500Å |
| $n_3$ - layer | n-Si | | |
| rear contact | same as Table 1 | | |

TABLE 3

Si/Si Tandem Solar Cells

| Component | Material | Thickness broadest | preferred |
|---|---|---|---|
| Substrate | Glass | | |
| transparent oxide | same as Table 1 | | |
| $p_1$ - layer | same as Table 1 | | |
| $i_1$ - layer | i-Si | 100–2000Å | 600–1000Å |
| recombination junction | same as Table 2 | | |
| $i_2$ - layer | i-Si | 1500–10000Å | 2500–4000Å |
| $n_2$ - layer | n-Si | | |

TABLE 4

Si/SiGe Tandem Solar Cells

| Component | Material | Thickness broadest | preferred |
|---|---|---|---|
| Substrate | Glass | | |
| transparent oxide | same as Table 1 | | |
| $p_1$ - layer | same as Table 1 | | |
| $i_1$ - layer | i-Si | 300–4000Å | 600–1750Å |
| recombination junction | same as Table 2 | | |
| $i_2$ - layer | i-SiGe | 750–5000Å | 1200–3000Å |
| $n_2$ - layer | n-Si | | |

Cell Testing and Characteristics

There are two standard tests of initial performance. In the first, light I-V measurement, the cell is placed under a light source providing simulated sunlight and its electrical performance is determined. A commercial or modified commercial simulator can be used. Sodium vapor lamps provide a bright steady light source. Although the spectrum of these lamps is different from the solar spectrum, we have found that as long as the light intensity is the same, the spectral distribution does not matter very much and can be accounted for. Cells are placed on the lamp, which is calibrated the same way as the simulator, and the electrical performance is monitored as a function of time.

The most significant measure of a solar cell is its conversion efficiency. The conversion efficiency is the percentage of the energy of the light impinging on the cell converted to electrical energy which can be used by an external load, e.g. a light bulb.

The energy in sunlight (striking a flat surface at solar noon) is about 100 mW/cm². For convenience, solar simulators are calibrated so that the energy that they radiate is as close as possible to 100 mW/cm². Therefore, the procedure is to measure how much energy is being produced by the cell when illuminated.

The output of a solar cell is shown in FIG. 1 where: $V_{oc}$=open circuit voltage, $P_{max}$=maximum solar cell power and $J_{sc}$=short circuit current. The solar cell produces power in the lower right hand quadrant of FIG. 1 between $J_{sc}$ and $V_{oc}$. The solar cell is absorbing power from the electronic test circuitry in the upper right hand and lower left-hand quadrants of FIG. 1. The power produced is the product of the current and voltage. Following the curve from left to right in FIG. 1, at the point where the curve crosses the current axis is where power is neither being produced nor absorbed (Power=voltage×current=0×$J_{sc}$). The current at this point is the short circuit current ($J_{sc}$). As we continue along the curve of FIG. 1, the product of voltage and current increases until finally at the point marked $P_{max}$ the product is maximum. Continuing further along the curve of FIG. 1 results in current-voltage products which are decreasing. Finally, we reach the voltage axis. At this point, the generated power is zero since current=0. The voltage at this point is called the open circuit voltage. The voltage and current at the maximum power point are referred to as $V_{max}$ and $J_{max}$, respectively.

The cell efficiency is determined by the maximum amount of power it can produce, which is the power at the maximum power point. While conversion efficiency can be defined as the ratio of energy produced to energy incident, it can also be defined in terms of power. The conversion efficiency of a solar cell can be determined as follows:

$$\begin{aligned} \text{Efficiency (\%)} &= (P_{max}/P_{incident}) \times 100 \\ &= (P_{max}/100) \times 100 \\ &= P_{max} \\ \text{Efficiency} = P_{max} &= V_{max} \times J_{max} \\ &= V_{oc} \times J_{sc} \times FF \end{aligned}$$

$V_{oc}$=Open circuit voltage, i.e. the voltage developed by cell in situation where no current is drown (cell is open circuited). If you measure the voltage across the terminals of your car battery with a voltmeter, you will be measuring the open circuit voltage (a little over 12V).

$J_{sc}$=Short circuit current, i.e. the current passed by cell if it is short circuited. If you drop a wrench across the terminals of your car battery, you will be passing the short circuit current (hundreds of amps) through the wrench. Short circuit currents on solar cells are much smaller and not nearly as dangerous.

*FF=ratio of $P_{max}$ to $V_{oc} \times J_{sc}$*

Figure 2:
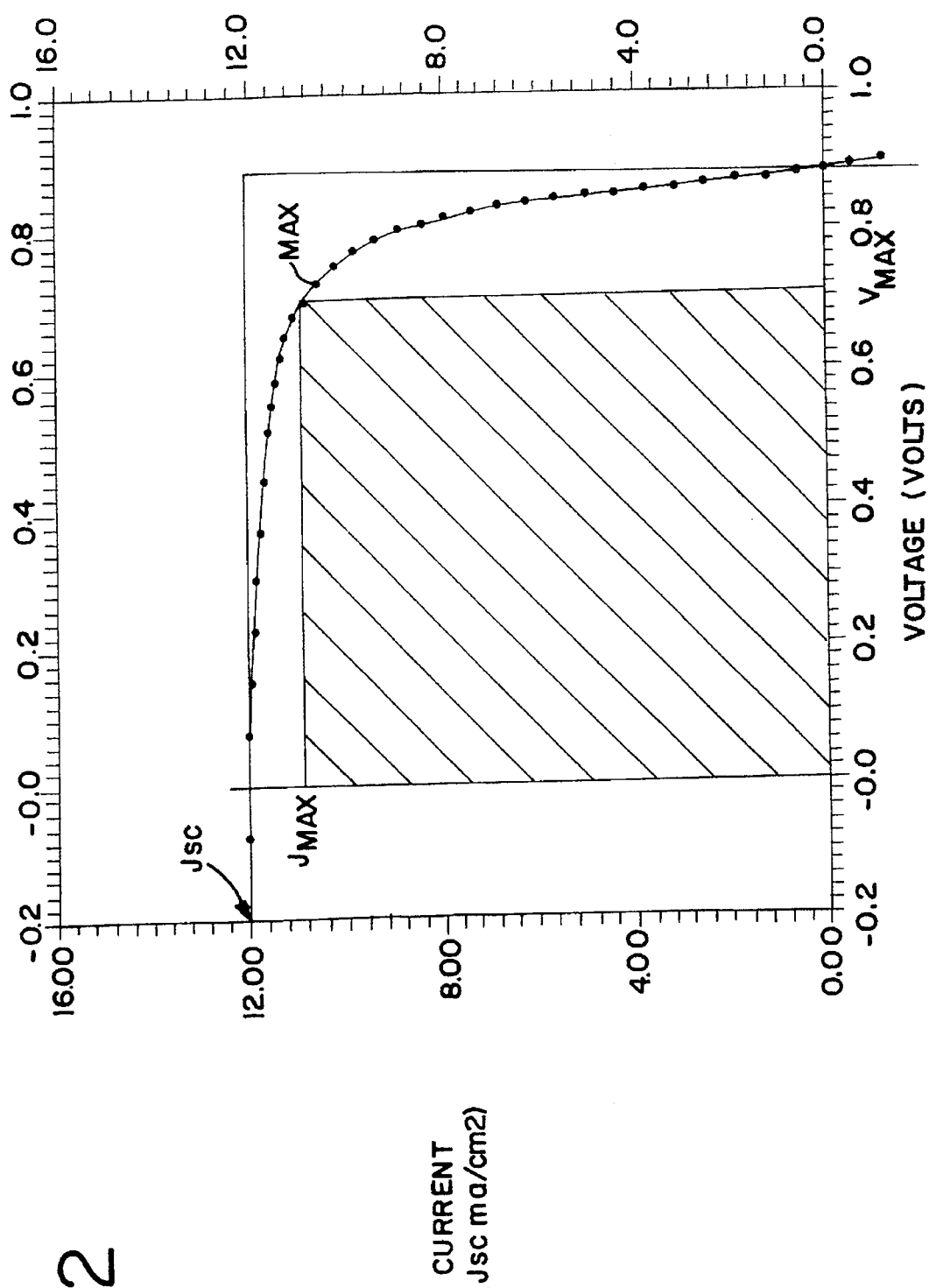
FIG. 2 is a graph illustrating the fill factor.

Efficiency is really given by: Efficiency=$(P_{max}/P_{incident}) \times$ 100. However, in practice $P_{incident}$ (power of light incident on cell) is set to 100 so that efficiency=$P_{max}$. Fill factor (FF) is a number used to express efficiency in terms of open circuit voltage ($V_{oc}$) and short circuit current ($J_{sc}$). Fill factor can be defined as the ratio of the small rectangle to the large rectangle in FIG. 2.

Amorphous Silicon Based Solar Cells Deposited from $H_2$-Diluted $SiH_4$ at Low Temperatures Amorphous silicon based solar cells have been developed which have both improved initial conversion efficiency and greater resistance to light induced degradation. The improved initial efficiency occurs from higher open circuit voltage ($V_{oc}$) which is a result of depositing the Mayer at lower temperatures from silane ($SiH_4$) diluted with hydrogen ($H_2$). The improvement in open circuit voltage ($V_{oc}$) is surprisingly substantially greater than would be expected from the small increase in optical bandgap that is observed as the deposition temperature is lowered. Also, the charge transport across the cell may change as the deposition temperature is lowered. By optimizing the deposition parameters, we were able not only to advantageously reduce the total light-induced degradation, but to affect a qualitative change in the nature of the functional dependence of the conversion efficiency on light soaking time, so that after a few hundred hours of light soaking time, the efficiency asymptotically approaches a limiting saturation value.

While investigating the influence of deposition temperature on stability, we noticed that lowering this temperature caused the open circuit voltage ($V_{oc}$) of the solar cells to increase faster than the optical gap and that as the deposition temperature was lowered, substantial increases in voltage were obtained. In the past, our experience had been that material deposited at lower temperatures suffered greater degradation than that deposited at higher temperatures. However, by optimizing the deposition conditions under which the high open circuit voltages ($V_{oc}$) are obtained, solar cells could be made which showed greatly improved stability compared to conventional standard cells made at high temperatures.

Experimental Details: a-Si:H

Both intrinsic films and p-i-n solar cells were studied. Films were deposited on both quartz and single crystal Si substrates. On some of the quarz substrates, nickel chromium (NiCr) pads had been pre-deposited to allow coplanar conductivity and diffusion length measurements. The films were between 0.5 and 1 micron thick and were deposited in the same way as the i-layers in the cells. Films were deposited from silane ($SiH_4$) with no dilution and from $SiH_4$ diluted in hydrogen ($H_2$) over a range of temperatures up to 270° C. Our normal deposition process involved deposition at 270° C. and no dilution. Optical measurements were made on the films using a Perkin Elmer spectrophotometer (model Lambda 9) and a PE Fourier transform infrared spectrometer (FTIR) (model 1750). Optical measurements were also made using photothermal deflection spectroscopy (PDS) and dark and photoconductivity measurements were made using a 4-point probe system. Minority carrier diffusion length was measured using the steady state photocarrier grating (SSPG) technique.

Figure 3:
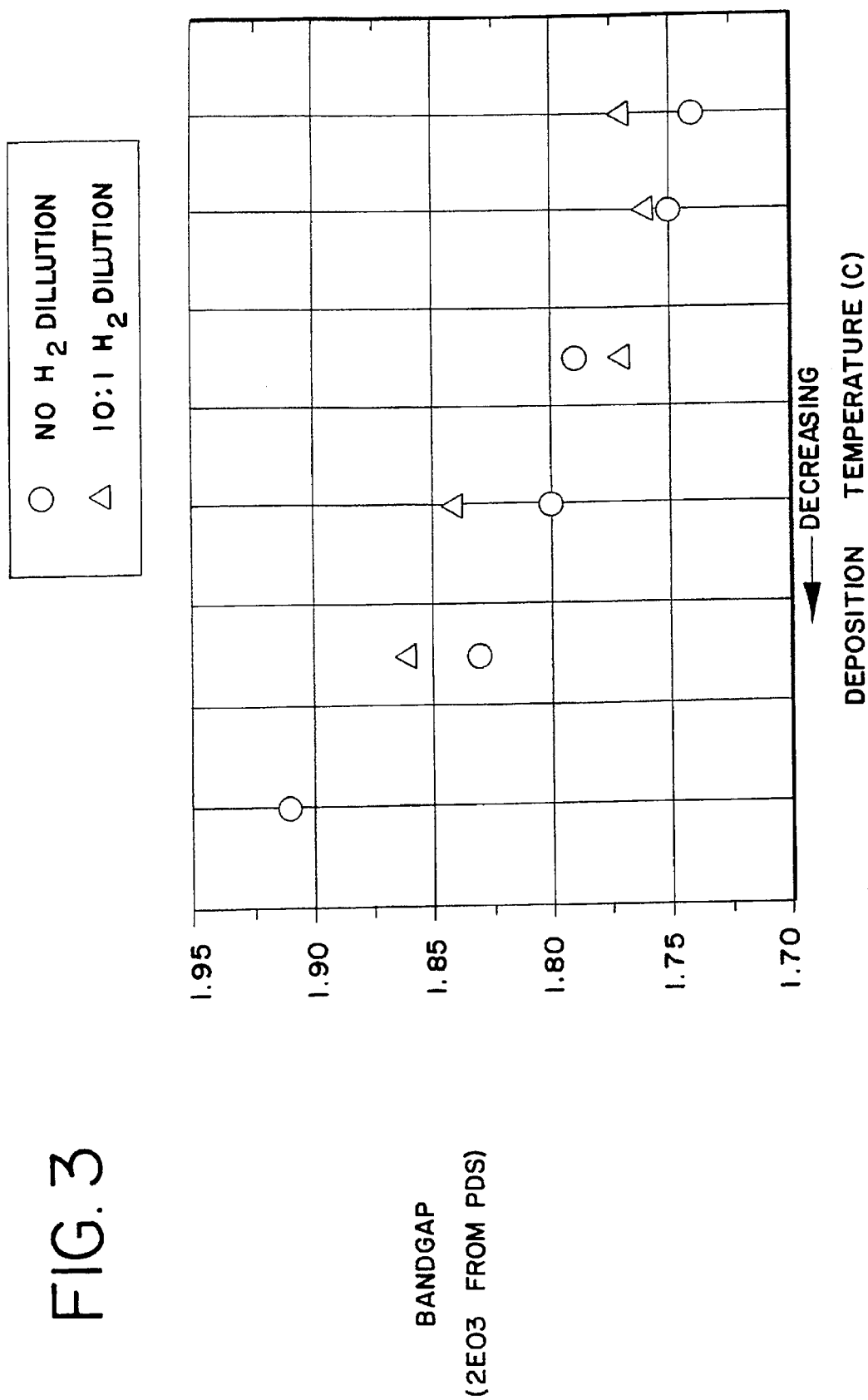
FIG. 3 is a graph of the optical bandgap as a function of deposition temperature for a particular set of deposition parameters.
Figure 4:
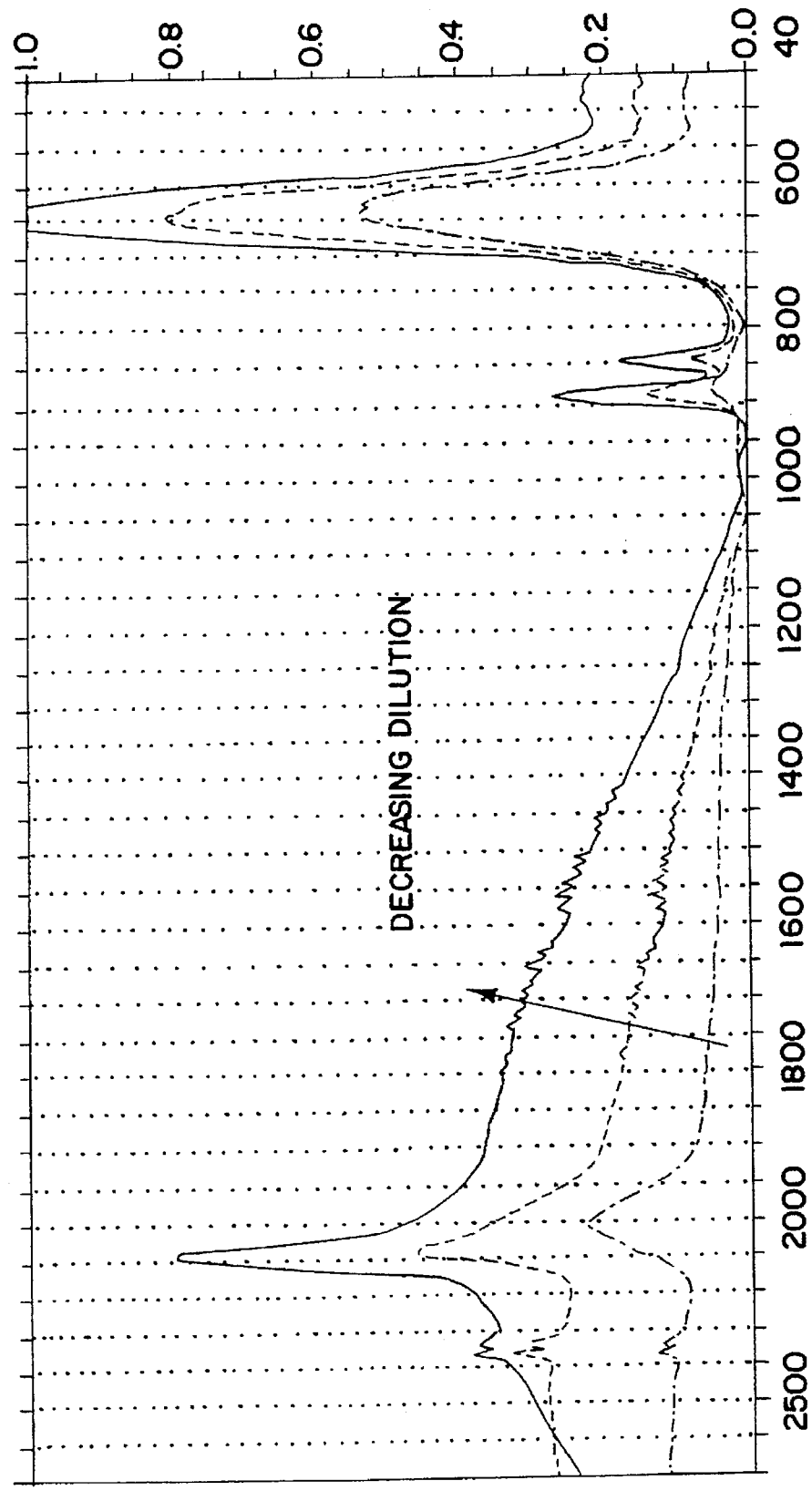
FIG. 4 is a graph of the infrared spectra of low temperature films.

Solar cells were deposited on tin oxide (TCO) coated glass and had the structure glass/TCO/p-SiC/i-Si(4000 Å)/n-Si/ZnO/Ag. In some cases, there was an i-SiC interface layer between the p-layer and i-layer. The i-layers were deposited without dilution or from hydrogen ($H_2$) diluted silane ($SiH_4$) at various temperatures and with various degrees of dilution. Solar cells deposited from $H_2$-diluted $SiH_4$ require small but very important changes in doped layers and in p-i interface layers and careful optimization of the deposition parameters. Some of these cells were deposited in a multi-chamber system (3 chambers—1 each for p, i, and n layers), others in single chamber deposition systems. Solar cell performance was measured on a multi-source solar simulator. Light soaking was carried out on sodium (Na) vapor lamps. FIG. 3 shows the optical bandgap as the deposition temperature is lowered for films deposited from silane ($SiH_4$) and from $SiH_4$ diluted in hydrogen ($H_2$). The gap changes by about 0.25 eV over the entire range of deposition temperature whether or not the $SiH_4$ is diluted in $H_2$ or not during the deposition. The effect of $H_2$ dilution, however, can be seen more clearly in the infrared (IR) spectra of low temperature films in FIG. 4. As the degree of dilution increases, the peaks at 2090 $cm^{-1}$ and 640 $cm^{-1}$ grow smaller, indicating that the total hydrogen content of the films is decreasing. Although dilution has improved the structure of the material as indicated by the spectra of FIG. 4, the width of the peak at 2000 $cm^{-1}$ is still broader than it is in films made at 270° C. without $H_2$ dilution. Although these films were not light soaked, the stability of cells can usually be related in an inversely proportional way to the size of the peak at 2090 $cm^{-1}$ in the IR spectrum of the material comprising their i-layers.

Figure 5:
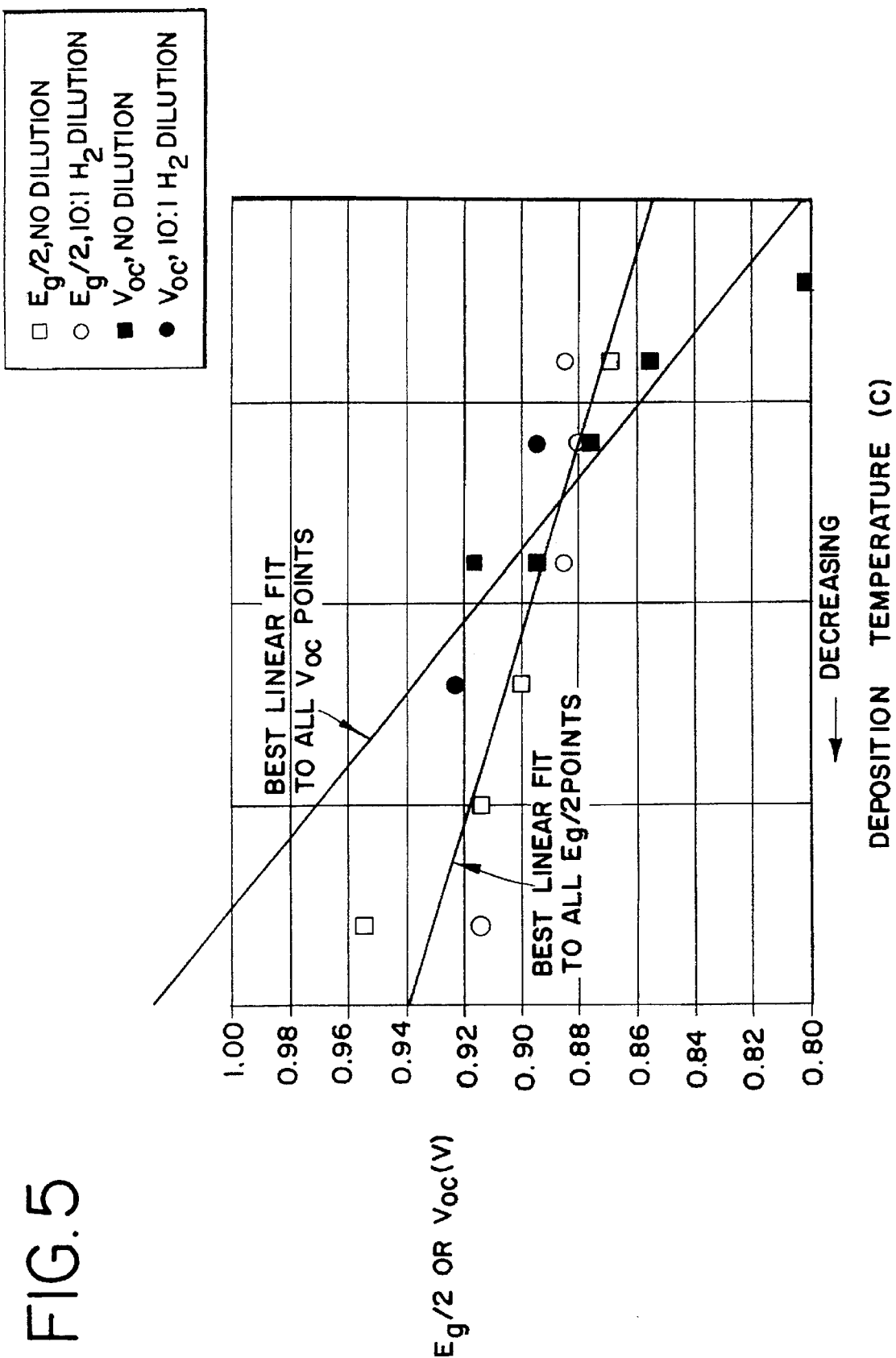
FIG. 5 is a graph showing the dependence of $V_{oc}$ and $E_g/2$ on the deposition temperature.

Solar cells were made incorporating the i-layers into single-junction p-i-n devices. FIG. 5 shows the dependence of $V_{oc}$ and $E_g/2$ on deposition temperature. The open circuit voltage depends on more than the optical bandgap. This result is true for cells made in either a single or multi-chamber deposition system. FIG. 5 shows the optical bandgap divided by two for the films, and the open circuit voltage for the corresponding cells as a function of deposition temperature in both cases. These results are for a particular dilution. However, the same result is obtained over the entire range of dilutions. The bandgap changes by about 0.04 eV as the deposition temperature is varied from 200° C. to 300° C. whether or not the silane (SiH$_4$) is diluted in hydrogen (H$_2$) or not during the deposition. The open circuit voltage (V$_{oc}$) changes by about three times as much over this range of deposition temperatures, again independently of the dilution. It can be seen that the improvement in V$_{oc}$ is not accompanied by any reduction in fill factor (FF), although there is a slight loss in current due to the bandgap shrinkage.

Table 5 compares the solar cell characteristics for a conventional standard cell, which has its i-layer deposited at 270° C. from silane (SiH$_4$) to the characteristics of a cell having its i-layer deposited at lower temperature as indicated in the process of this invention.

TABLE 5

Solar Cell Characteristics for Different Deposition Temperatures

| Deposition Condition | V$_{oc}$ | Fill Factor | J$_{sc}$ | Efficiency |
|---|---|---|---|---|
| Low temperature, optimized deposition | 0.925 | 0.705 | 13.9 | 9.06 |
| Standard deposition, 270° C. | 0.864 | 0.698 | 14.2 | 8.56 |

Figure 6:
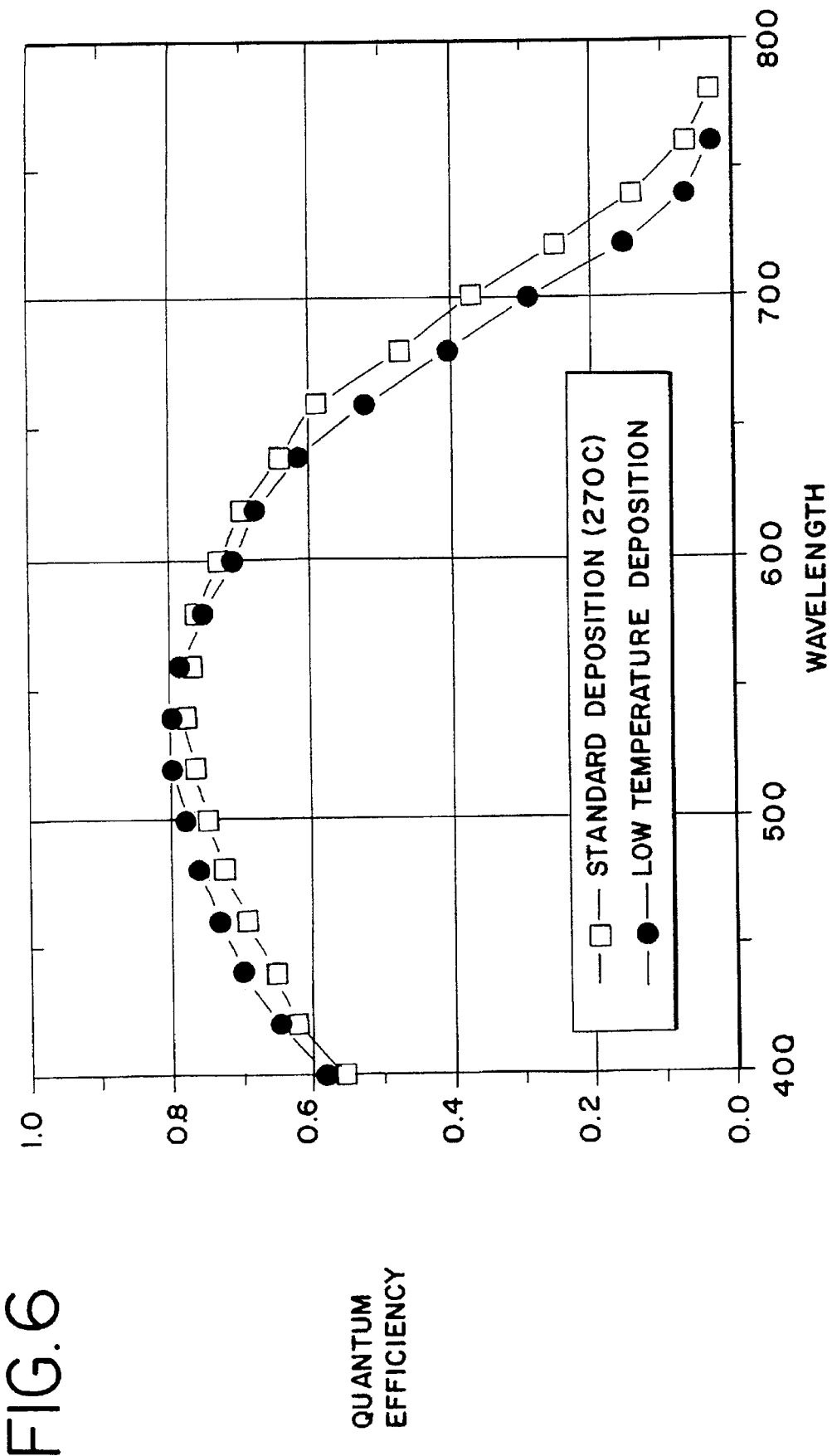
FIG. 6 is a graph of the quantum efficiency as a function of wavelength.

As seen in Table 5, there is a substantial gain in V$_{oc}$ and a small loss in J$_{sc}$ resulting in a large overall gain in efficiency. FIG. 6 compares the quantum efficiency for the two devices in Table 5. FIG. 6 indicates that the loss in current is a consequence of the slight increase in bandgap due to the low temperature deposition. The differences shown in Table 5 and FIG. 6 are due to the lowering of the deposition temperature. Whether or not H$_2$-dilution is used has little or no impact on the initial cell efficiency except at very low temperatures.

Figure 7:
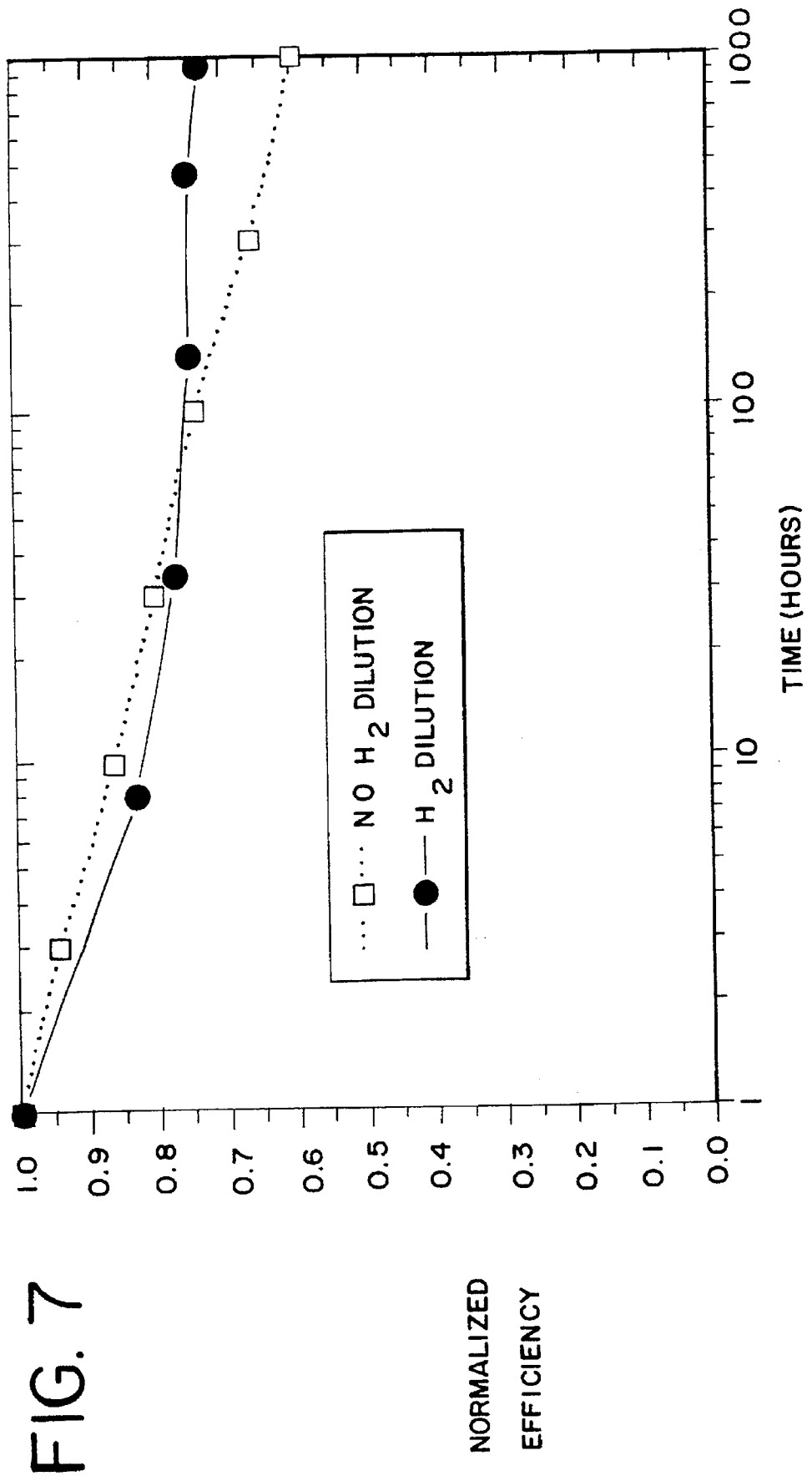
FIG. 7 is a graph of normalized efficiency over light-soaking time.

Solar cells made under standard conditions of no hydrogen (H$_2$ dilution at 270° C. show a linear decrease in efficiency with the log of exposure time. However, cells made at lower temperatures show a qualitatively different functional dependence of efficiency on exposure time. The comparison is shown in FIG. 7 where it can be seen that the solar cell fabricated at lower temperatures under H$_2$-dilution shows a slowing of the rate of degradation and is approaching saturation. The solar cells whose performance over time is shown in FIG. 7 do not have a-SiC p-i interface layer. If these cells are provided with an optimized SiC p-i interface layer and, hence, a considerably higher initial efficiency, they do not suffer as great a light-induced degradation. Cells deposited at low temperature with H$_2$-dilution also show not only a higher initial open circuit voltage (V$_{oc}$) but also improved stability in their open circuit voltage (V$_{oc}$). Previously, the loss of V$_{oc}$ was about 5% in 1000 hours. The low temperature H$_2$-diluted devices, even though they have higher open circuit voltage (V$_{oc}$) decay by only about 2 or 3%.

Figure 8:
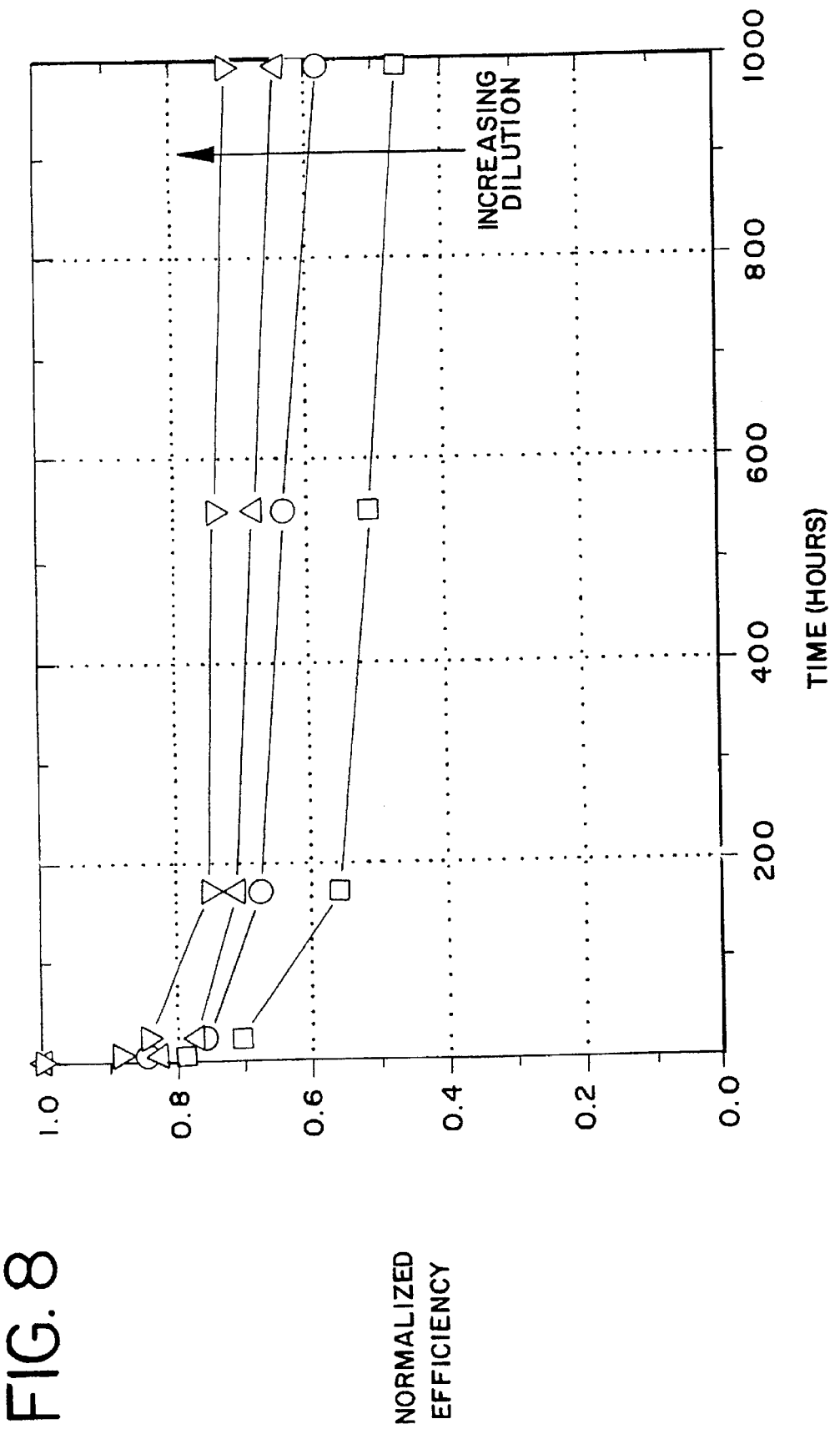
FIG. 8 is a graph showing the effects of increasing hydrogen dilution on the normalized efficiency over light-soaking time.

We also investigated the effect of the amount of H$_2$-dilution on stability. We found that the effect of dilution on the infrared (IR) spectra of films shown in FIG. 4 is reflected in the curves of efficiency versus time in FIG. 8. Just as the apparent stability of the films improves with increasing dilution, so does the stability of the cells improve as the amount of dilution used in growing the i-layer increases.

Dark I-V measurements were made on some of the cells. These showed diode factors as high as 1.98 compared to about 1.7, which is what we typically measure on cells deposited at high temperature. Furthermore, there is less degradation of the diode characteristic. Previously, the diode factor would increase from about 1.7 to about 2.35 with light soaking. The cells deposited at low temperature show a much smaller increase, typically from 2.0 to about 2.2.

Measurements show that the are bipolar diffusion length (by SSPG), photoconductivity and dark conductivity (coplanar measurement) and Urbach energy and subgap absorption (by PDS) do not depend on the presence or absence of hydrogen (H$_2$) dilution and are very weak functions of temperature. The only significant observed differences, aside from the slight change in bandgap, were in the infrared CIR) spectra which were very dependent on the degree of dilution at low deposition temperatures. Given the close similarity between the films grown without H$_2$-dilution at 270° C. and those grown with H$_2$-dilution at low temperature, the difference between the cells made under the two conditions is surprising. The increase in voltage can be only partially explained by the increase in bandgap. The remainder of the increase must be related to differences in transport as exemplified by the difference in the diode quality factor. This may reflect a difference in the recombination processes occurring throughout the i-layer and/or at the p-i interface. In cells made at high temperature, the diode factor is typically 1.7–1.75 and never as high as 1.9. An improvement in transport which may be responsible in part for the increase in V$_{oc}$ in cells may be occurring primarily in the p-i interface region. The "mobility gap" may increase faster than E$_g$ as the deposition temperature is lowered.

There is a strong dependence of open circuit voltage (V$_{oc}$) on deposition temperature. The dependence of V$_{oc}$ on deposition temperature is a function of cell structure.

The improvement in stability is a result of optimization of deposition parameters and cell structure. At low temperatures, the film property that we associate with stability, infrared (IR) spectra, showed significant improvement as dilution was increased. In the past, we have always considered the Staebler-Wronski effect to be a bulk effect since as the i-layer thickness goes to zero, the degradation goes to zero with a nearly linear dependence. While under certain circumstances the p-i interface could be shown to worsen stability, this was usually a small effect compared to that of thickness.

It can be seen that deposition of hydrogenated amorphous silicon (a-Si:H) at low temperatures from silane (SiH$_4$) diluted in hydrogen (H$_2$) has led to improved efficiency through an increase in open circuit voltage (V$_{oc}$) which is much larger than the small decrease in short circuit current (J$_{sc}$) which resulted from the small increase in bandgap. Optimization of the deposition parameters has led to improved stability and the change in character of the functional dependence of the efficiency on light-soaking time. The saturation of efficiency after a few hundred hours is a qualitatively different behavior than we have seen in the past. This has resulted in substantial improvements in both cell and module performance. Significantly, initial efficiencies for both small area cells and large area modules now exceed 11%. Degradation of efficiency as low as 15% in 1000 hours has been observed. We have made small area cells with stabilized efficiencies in excess of 9% and modules with stabilized efficiencies just under 9%. Besides a reduction in the total light-induced degradation, there is a qualitative change in the nature of the degradation kinetics.

In the above tests, both films and cells were made. The films were deposited from silane (SiH$_4$) with no dilution at a nominal temperature of 270° C. and from SiH$_4$ diluted in hydrogen (H$_2$) at temperatures ranging from 150° C. to 280° C. The ratio of H$_2$:SiH$_4$ was as high as 400:1. Cells were deposited on tin oxide coated glass and had the structure glass/TCO/p-SiC/i-Si/n-Si/ZnO/Ag. The i-layers were deposited without dilution or from $H_2$-diluted $SiH_4$ at various temperatures and with various degrees of dilution in the same way as the films as outlined above.

Amorphous Silicon-Carbon Alloy Solar Cells

Recent progress by means of this invention in optimizing deposition conditions has significantly improved the opto-electronic properties of intrinsic a-SiC:H alloys. These improvements have been incorporated in single-junction p-i-n solar cells. Open circuit voltage ($V_{oc}$) as high as 1.04V and fill factor (FF) as high as 0.75 have been demonstrated by the process of this invention. The stability of these devices has also been remarkably and surprisingly improved. The inventive single-junction solar cell with ~1000 Å thick a-SiC:H i-layer shows only 13% degradation and retains $V_{oc}$=0.98V and FF=0.68 after 1700 hours of light-soaking under AM1.5 equivalent illumination.

The stabilized performance of a-Si:H based solar cells can be increased by using a multi-junction approach, the most attractive being a monolithic device structure in which three junctions are stacked on top of each other such that the i-layer of each component of the triple junction is in the order of $E_{g1}>E_{g2}>E_{g3}>$ with light entering from the side $E_{g1}$, where $E_g$ is the bandgap of the respective i-layer. In the triple-junction approach, the bandgap and thickness of each component cell is optimized to respond to different parts of the solar spectrum which allows higher performance and better stability. It has been shown theoretically that with the bandgap combination of 2.0eV/1.7 eV/1.45 eV, the maximum conversion efficiency can be as high as 24% using a-Si:H alloys with opto-electronic properties comparable to those of a-Si:H. This requirement necessitates the development of intrinsic wide bandgap alloys for use in the front junction of triple-junction cells. Hydrogenated amorphous silicon-carbon alloys (a-SiC:H) are attractive because they can be deposited from readily available feedstocks such as silane ($SiH_4$)+methane ($CH_4$) and the bandgap can be tailored from 1.7 eV to 2.0 eV.

We have developed a-SiC:H intrinsic layers for this purpose. We have studied the opto-electronic properties of intrinsic glow-discharge a-SiC:H alloys prepared by decomposition of novel carbon containing feedstocks such as trisilylmethane (TSM) and by decomposition of methane diluted with hydrogen.

Experimental Details: a-SiC:H

The hydrogenated amorphous silicon carbon (a-SiC:H) films and solar cells were grown in a load-locked radio frequency (RF) glow-discharge chamber. The films were characterized by optical bandgap, Urbach energy, sub-bandgap optical absorption spectrum (derived by PDS), steady state photoconductivity and the derived electron mobility-lifetime product ($\mu\tau$), dark conductivity ($\sigma_d$) and its temperature dependence, infrared (IR) transmission spectrum, and steady state are bipolar (hole) diffusion length ($L_b$). The optical bandgap ($E_g$) is empirically defined as the energy at which the optical absorption coefficient equals $2\times10^3$ $cm^{-1}$. The p-i-n single-junction solar cells were deposited on textured-$SnO_2$ coated glass substrates with ZnO/Ag rear contacts. The p-layer is boron doped a-SiC:H and the n-layer is a-Si:H, both being similar to those used in conventional a-Si:H devices.

Properties of Undoped a-SiC:H Films

The opto-electronic properties of wide bandgap hydrogenated amorphous silicon (a-Si:H) alloys are a strong function of optical bandgap and deteriorate rapidly as the bandgap increases. It is important to compare films with the same bandgap.

Figure 9:
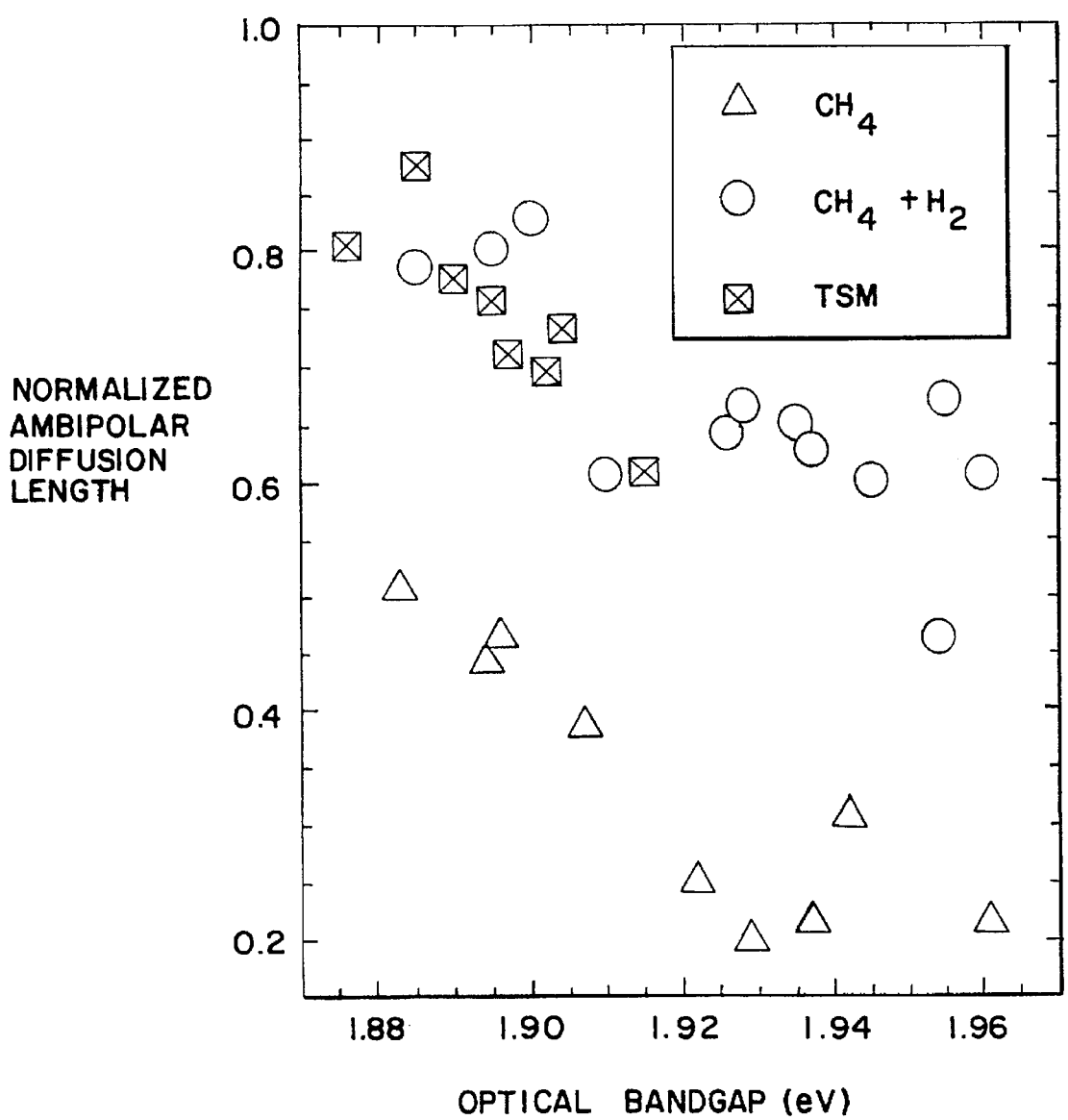
FIG. 9 is a graph showing the variation of are bipolar (hole) diffusion length for various amorphous silicon carbon films.

FIG. 9 shows the variation of ambipolar (hole) diffusion length ($L_b$) of a large number of a-SiC:H films deposited from trisilylmethane (TSM) or from silane ($SiH_4$)+methane ($CH_4$) with and without hydrogen dilution. The diffusion lengths were measured by the SSPG (steady state photocarrier grating) method. As a reference, the $L_h$ value for intrinsic a-Si:H ($E_g$~1.76 eV) is about 1400 Å. Films deposited from either TSM or $H_2$-dilution of $SiH_4$+$CH_4$ mixtures have higher diffusion lengths than those deposited without $H_2$-dilution. Similar results are seen in the electron transport data: the $CH_4$+$H_2$ and TSM (with H-dilution) films show comparable $\mu\tau$ values that are notably higher than the reference data from $CH_4$ based films made without gas phase $H_2$-dilution.

Figure 10:
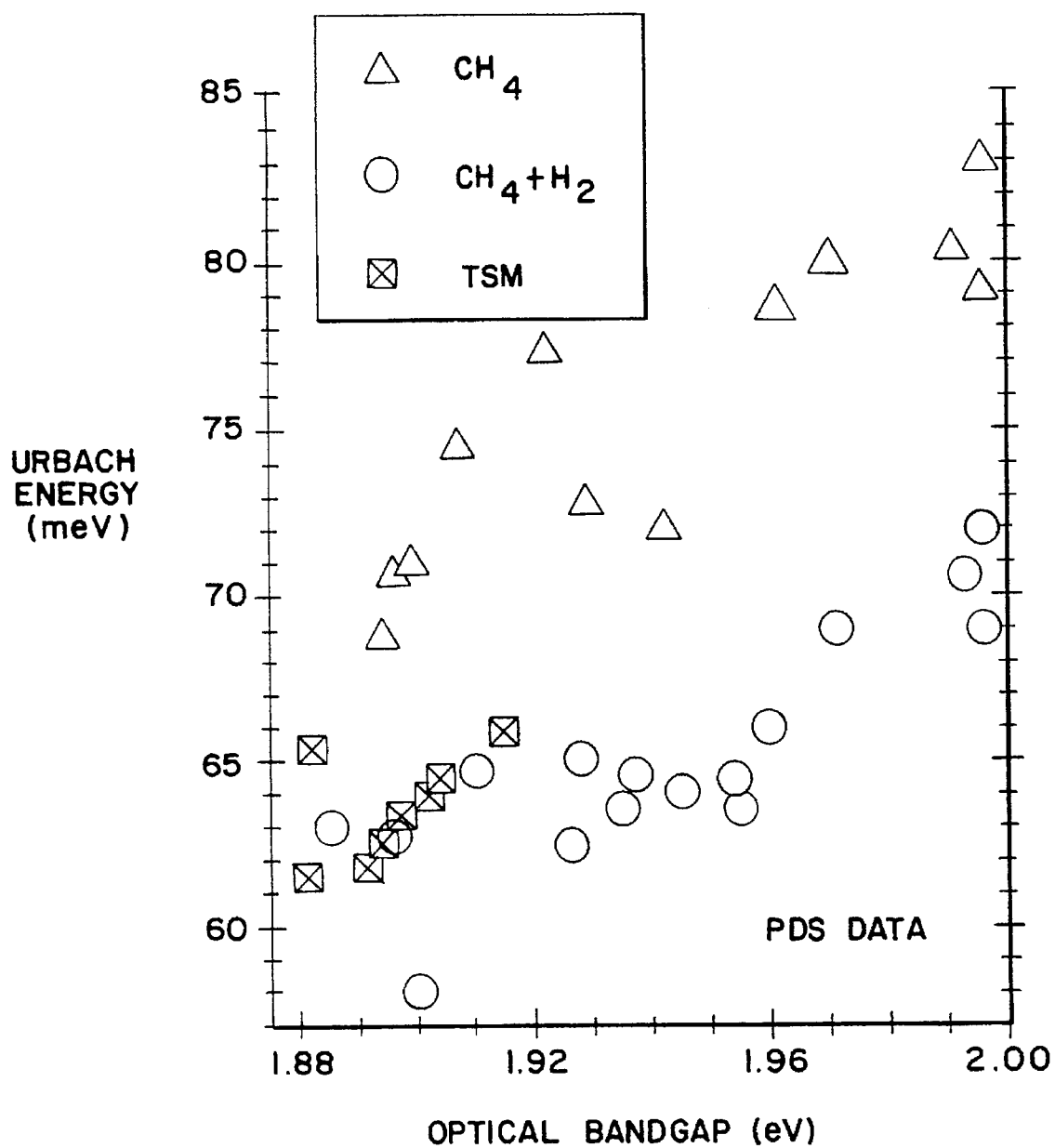
FIG. 10 is a graph of the Urbach energy for amorphous silicon carbon films.

FIG. 10 displays the variation with $E_g$ of the PDS derived Urbach energy ($E_o$) for representative a-SiC:H films made from TSM and $CH_4$ with $H_2$-dilution. The Urbach energy for normal unalloyed a-Si:H is 57-58 eV. Again, the data from $CH_4$ based alloys made without $H_2$-dilution are included for comparison. The $CH_4$+$H_2$ process produced $E_o$ values lower than that for TSM based films of the same bandgap ($E_g$≅1.90 eV). The near midgap defect absorption levels are comparable for TSM and $CH_4$+$H_2$based alloys.

Hydrogen dilution of silane ($SiH_4$)+methane ($CH_4$) has been found to significantly improve the quality of a-SiC:H films. Films prepared with this feedstock mixture have been studied in two temperature regimes: (i) $T_g$≧300° C. and (ii) $T_g$<250° C. Lower temperature films are generally superior to higher temperature films. It is advantageous to incorporate more hydrogen (at low temperature) to help widen the optical bandgap of a-SiC:H.

Figure 11:
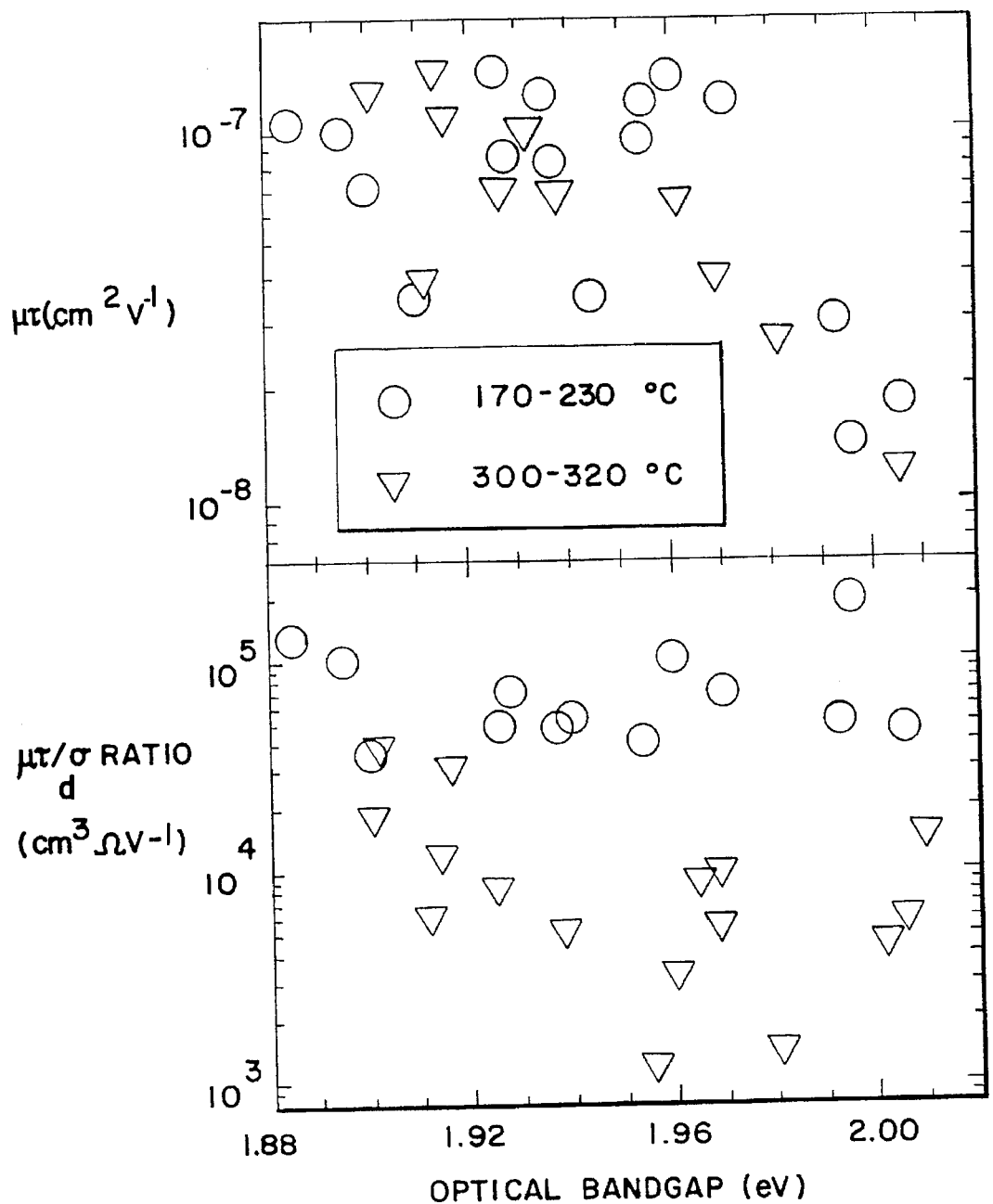
FIG. 11 is a graph of the photoelectron μτ for various bandgaps.

FIG. 11 illustrates the variation in electron $\mu\tau$ derived from steady state photocurrents and the ratio of $\mu\tau$ to room temperature dark conductivity, $\sigma_d$, as a function of bandgap of a-SiC:H films prepared in the two $T_g$ ranges: (1) 170°–230° C., and (2) 300°–320° C.

Figure 12:
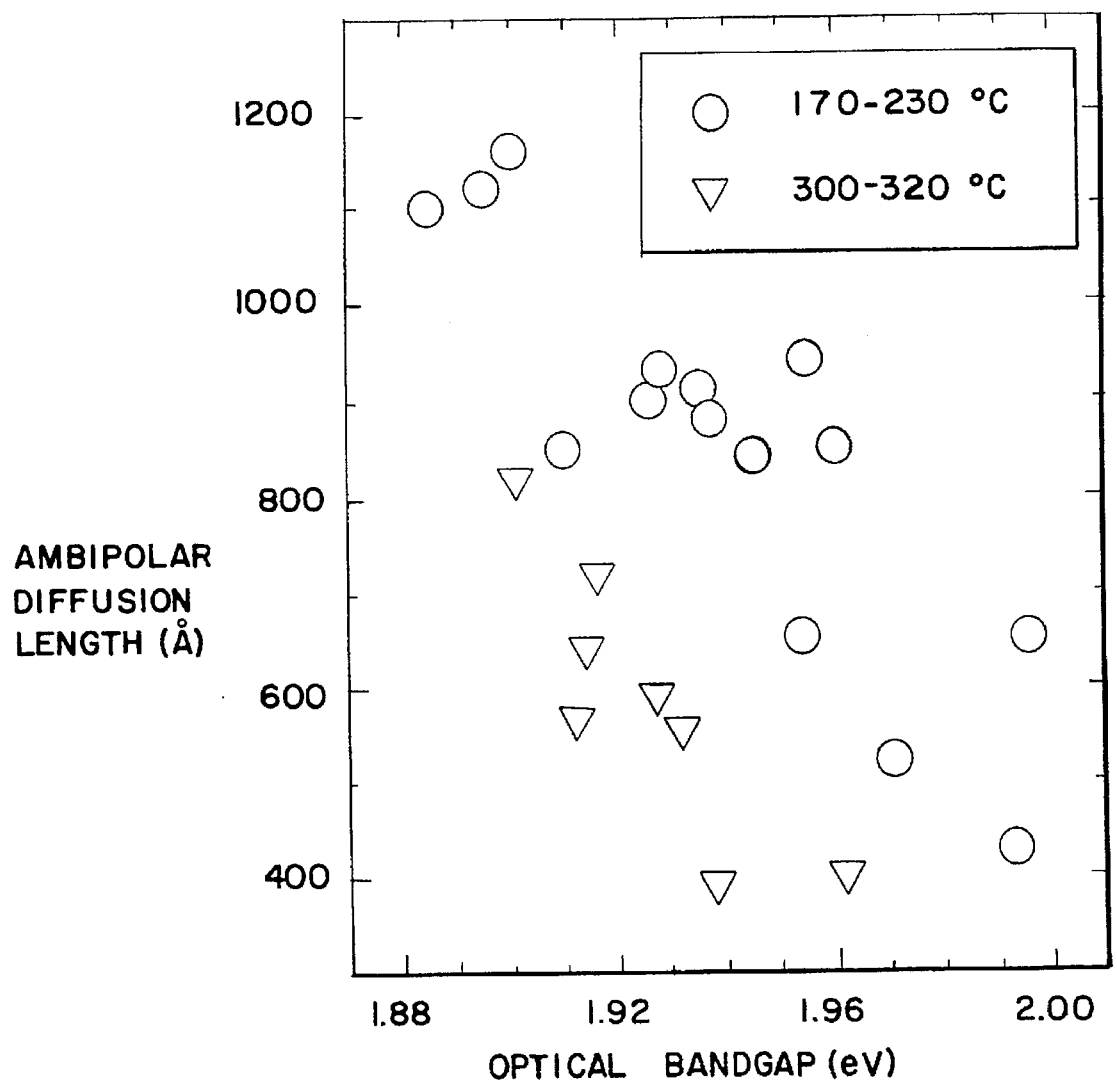
FIG. 12 is a graph of are bipolar (hole) diffusion for various bandgaps.

FIG. 12 shows the variation of hole diffusion ($L_b$) for hydrogenated amorphous silicon carbon (a-SiC:H) films prepared with $H_2$-dilution in the same two temperature ranges as in FIG. 11. The hole diffusion lengths are higher for films prepared at lower temperatures. In file bandgap region of 1.90 eV to 1.95 eV, the hole diffusion length of about 800 Å shows little variation. Significantly, a-SiC:H films ($E_g$≦2.0 eV), deposited from $SiH_4$+$CH_4$ mixtures diluted with hydrogen and at moderate deposition temperatures exhibit significantly higher electron mobility-lifetime product and greater ambipolar diffusion lengths. They also show sharper optical absorption (Urbach) edge, lower sub-bandgap optical absorption, and improved atomic bonding structure compared to films deposited with no $H_2$-dilution and films made with $H_2$-dilution at $T_g$≧300° C.

Initial Performance: a-SiC:H Solar Celts

The initial photovoltaic parameters of five different hydrogenated amorphous silicon carbon alloy solar cells are shown below in Table 6.

TABLE 6

Initial Photovoltaic Parameter of a-SiC:H Cells

| Device # | $V_{oc}$ (volt) | $J_{sc}$ (mA/cm$^2$) | Fill Factor | Efficiency | i-layer thickness (Å) |
|---|---|---|---|---|---|
| A2351-2 | 0.97 | 7.20 | 0.75 | 5.24 | ~750 |
| A2337-1 | 1.00 | 7.40 | 0.74 | 5.48 | ~900 |
| A3007-1 | 1.03 | 5.40 | 0.73 | 4.06 | ~900 |

TABLE 6-continued

Initial Photovoltaic Parameter of a-SiC:H Cells

| Device # | $V_{oc}$ (volt) | $J_{sc}$ (mA/cm$^2$) | Fill Factor | Efficiency | i-layer thickness (Å) |
|---|---|---|---|---|---|
| A2357-3 | 1.04 | 5.80 | 0.72 | 4.51 | ~900 |
| A3008-3 | 1.04 | 5.40 | 0.70 | 3.93 | ~1000 |

The improvements in material properties of intrinsic a-SiC:H alloys have led to p-i-n solar cells with higher open circuit voltages ($V_{oc}$) and better fill factors (FF). Very thin i-layers are needed for devices used as the front junction in triple-junction solar cells. In order to generate more than 7 mA/cm$^2$ current from the front junction, depending on the bandgap of the intrinsic layer, the thickness of the i-layer can vary from ~650 to ~1000 Å as the bandgap is varied from 1.7eV to near 2.0 eV. Single-junction p-i-n devices with a $V_{oc}$ as high as 1.04V and fill factors (FF) as high as 0.75 have been fabricated by the process of this invention.

Figure 13:
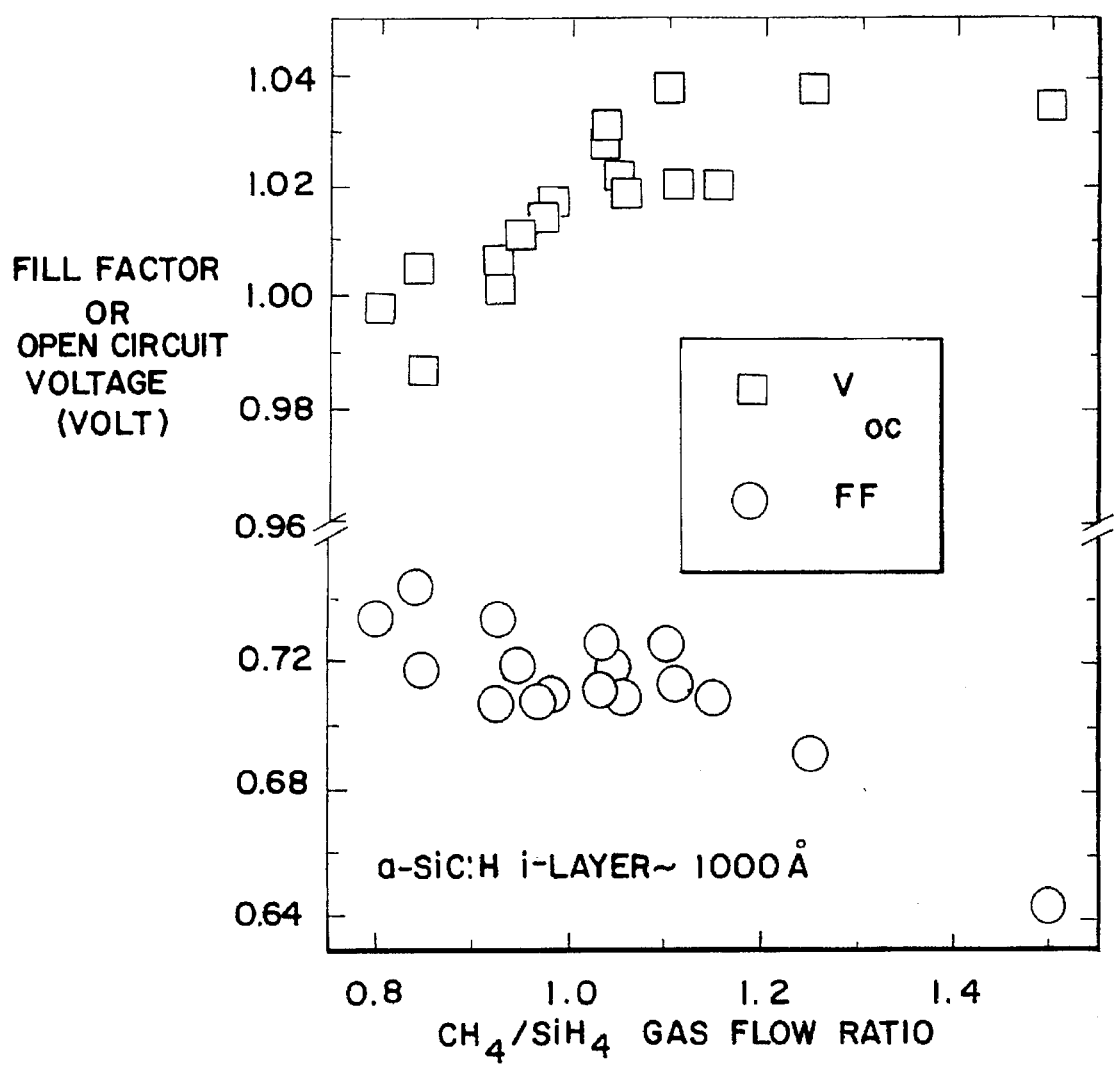
FIG. 13 is a graph of the open circuit voltage ($V_{oc}$) and fill factor (FF) as a function of the methane to silane gas ratio for hydrogenated amorphous silicon carbon solar cells.

FIG. 13 depicts the variations of open circuit voltage ($V_{oc}$) and fill factor (FF) as a function of the methane to silane (CH$_4$/SiH$_4$) gas ratio (i-layer bandgap) for a series of p-i-n solar cells with an i-layer of hydrogenated amorphous silicon carbon (a-SiC:H) fabricated under similar conditions. The open circuit voltage ($V_{oc}$) begins to saturate at about 1.03–1.04V. Increase in the bandgap of a-SiC:H i-layer does not result in higher $V_{oc}$ even though the fill factors (FF) remain relatively high (i.e. greater than 0.6), implying limitations on $V_{oc}$ due to the present a-SiC:H p-layer and a-Si:H n-layer doped layers and the resultant built-in potential. A higher open circuit voltage ($V_{oc}$) can also be attained with improvements in the doped layers, particularly the p-layer.

Figure 20:
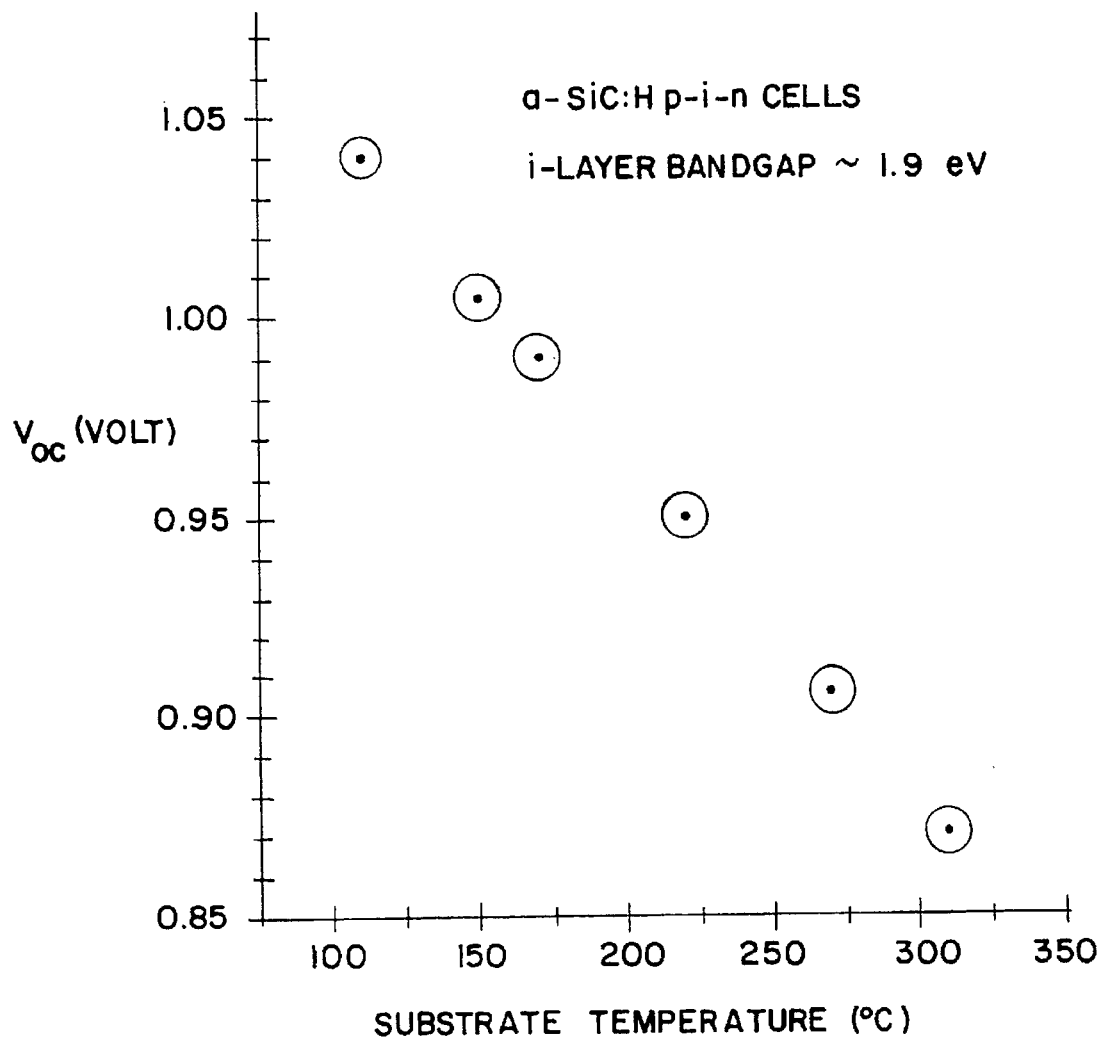
FIG. 20 is a graph showing the relationship of the open circuit voltage and substrate temperature for a fixed i-layer optical bandgap.

FIG. 20 shows the variation of $V_{oc}$ with the substrate temperature for a-SiC cells, whose bandgap is fixed at 1.9 eV. Surprisingly and unexpectedly, the graph of FIG. 20 shows that contrary to conventional understanding, a significantly higher $V_{oc}$ can be attained at a lower temperature for a given i-layer bandgap.

Figure 14:
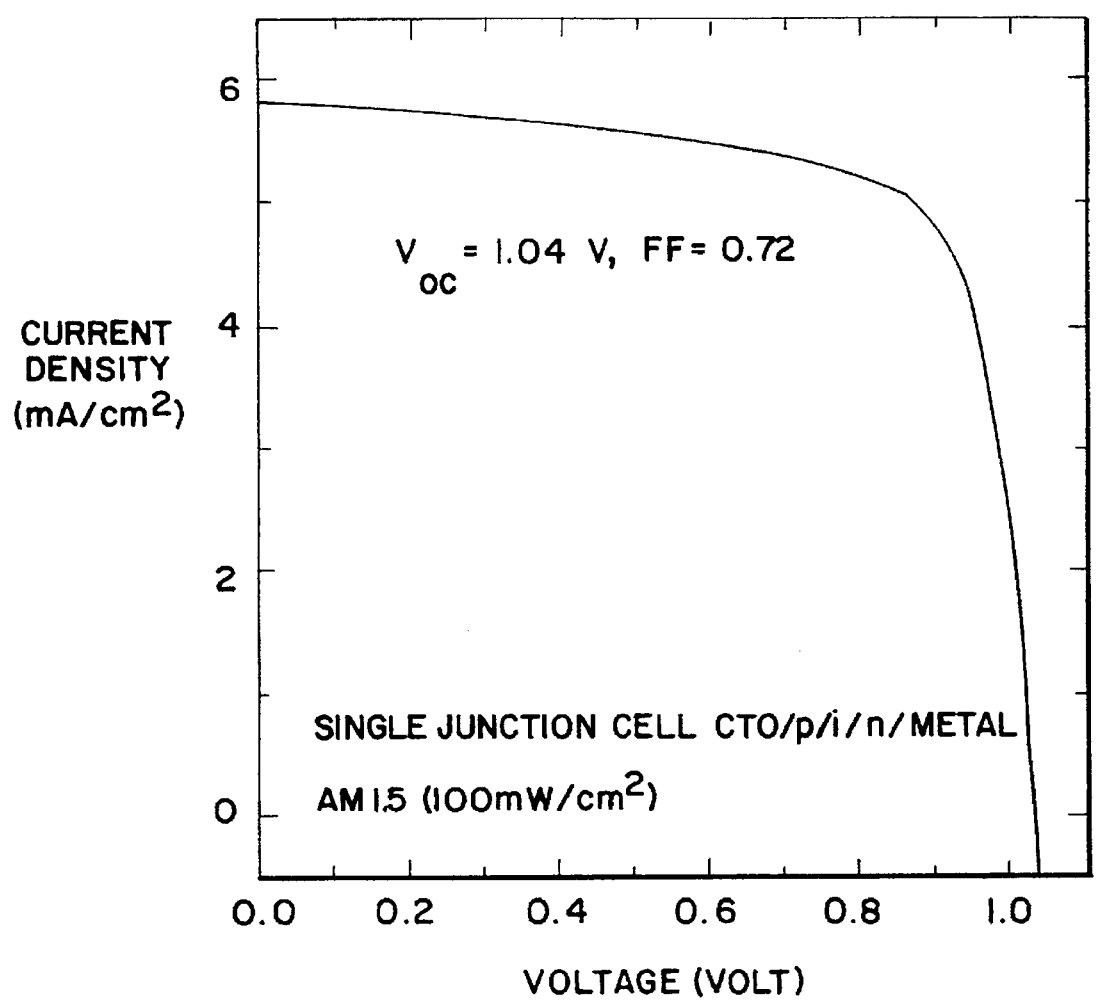
FIG. 14 is a graph of the current density and voltage for a single-junction, amorphous silicon carbon, solar cell.

The current and voltage (J-V) characteristics of a single-junction hydrogenated amorphous silicon carbon (a-SiC:H) solar cell with a high open circuit voltage ($V_{oc}$) is shown in FIG. 14. This device had a $V_{oc}$ of 1.04V with a fill factor (FF) of 0.72.

We have demonstrated initial efficiencies of over 11% for a-Si:H/a-SiH/a-SiGe:H triple-junction modules with the process of this invention. When the high quality a-SiC:H i-layer is incorporated in the top junction of triple-junction devices, the conversion efficiency can be increased by 4–5 % due to a higher open circuit voltage ($V_{oc}$).

Stability of a-SiC:H Solar Cells

Amorphous silicon-carbon alloy i-layer devices have been previously plagued with poor stability against continuous light-soaking. Improvements made in deposition of better quality intrinsic a-SiC:H alloys in accordance with this invention have also resulted in improved stability of single-junction devices.

Figure 15:
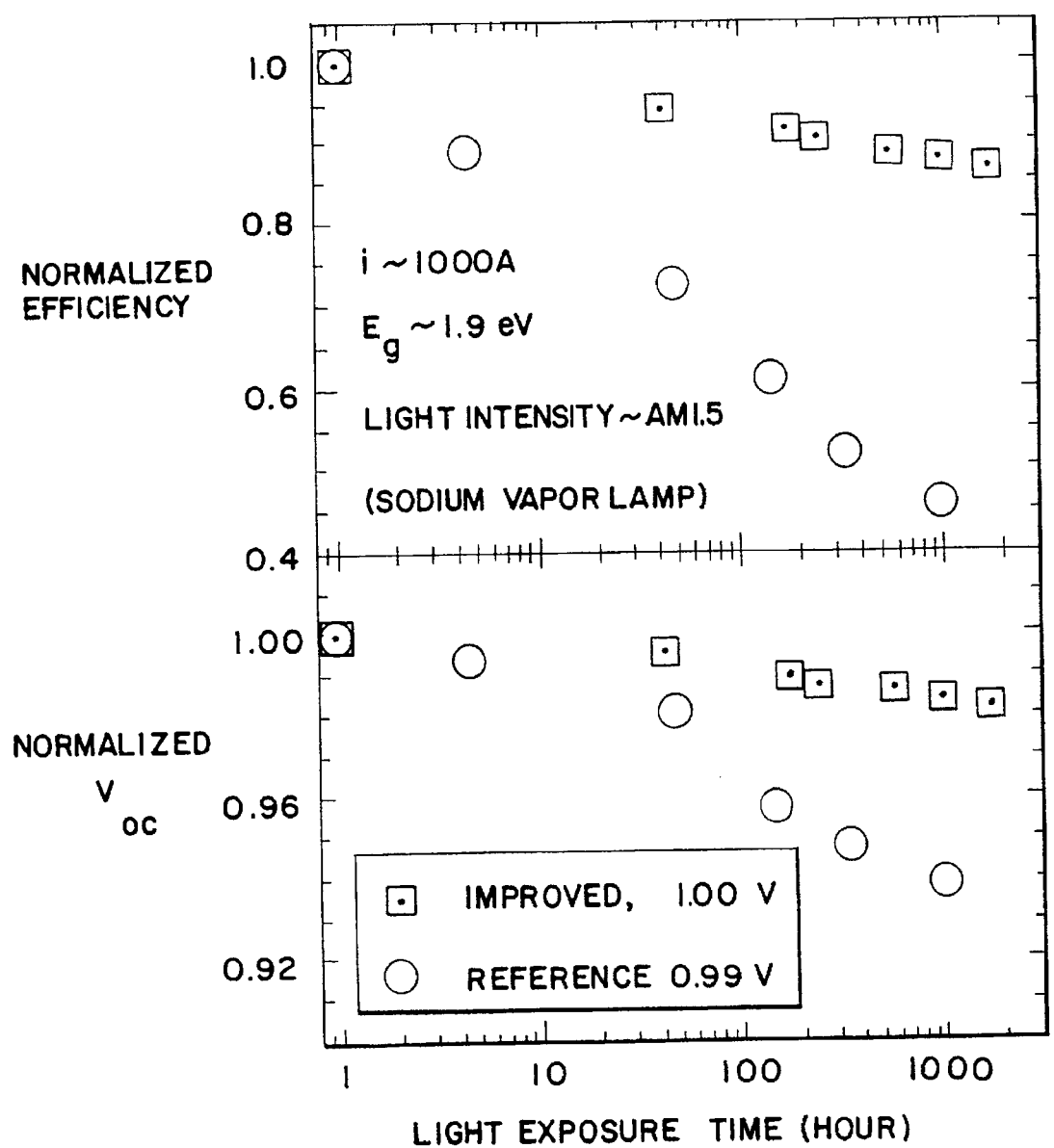
FIG. 15 is a graph of the degradation of normalized efficiency and open circuit voltage ($V_{oc}$)

FIG. 15 shows the degradation in normalized conversion efficiency and in open circuit voltage ($V_{oc}$) of two a-SiC:H i-layer single-junction solar cells. The i-layer thickness is about 1000 Å and $E_g$~1.90 eV. The improved cell was made under present optimum conditions of H$_2$-dilution of silane (SiH$_4$)+methane (CH$_4$) mixtures and had an initial $V_{oc}$ of 1.0V and FF>0.72. The reference cell had initial $V_{oc}$ of 0.93V and FF=0.61 and was fabricated with H$_2$-dilution at a higher temperature. Advantageously, the improved cell shows excellent stability required for its application in triple-junction devices. The degradation in efficiency for the improved a-SiC:H cell is significantly less than that observed in previously deposited a-SiC:H cells such as the reference cell.

Figure 16:
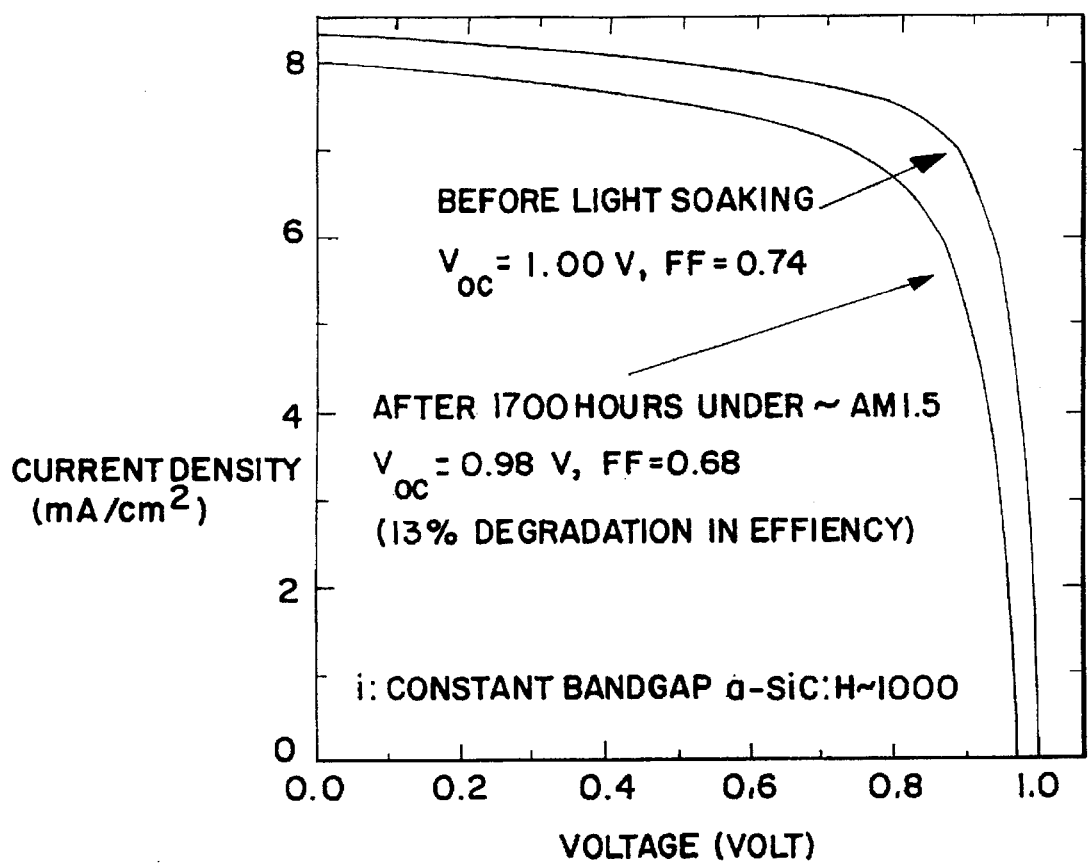
FIG. 16 is a graph of the current density and voltage before and after light soaking.

FIG. 16 portrays the current-voltage (JV) curves of a hydrogenated amorphous silicon carbon solar cell before and after an extended period of simulated solar illumination under a sodium (Na) vapor lamp at a temperature of approximately 50° C. The improved stability of a-SiC:H devices is shown in FIG. 16 where the current-voltage (J-V) characteristics of a single-junction device is plotted before and after 1700 hours of light-soaking under simulated AM1.5 illumination. Significantly, the overall performance degrades by only 13% and the device retains an open circuit voltage ($V_{oc}$) of 0.98V and a fill factor (FF) of 0.68. To date, these are among the highest parameters, after light soaking, of any single-junction a-SiC:H i-layer device that we have fabricated.

The rate of degradation of a-SiC:H i-layer devices can go up rapidly with increasing initial open circuit voltage ($V_{oc}$) or the i-layer carbon content. For example, several a-SiC:H solar cells (i $\leq$1000 Å) with an initial $V_{oc}$ of 1.02–1.03V exhibited about 50–70 mV loss of $V_{oc}$ and about 11% reduction in FF after 1000 hours of simulated AM1.5 light soaking with a sodium (Na) vapor lamp.

Figure 17:
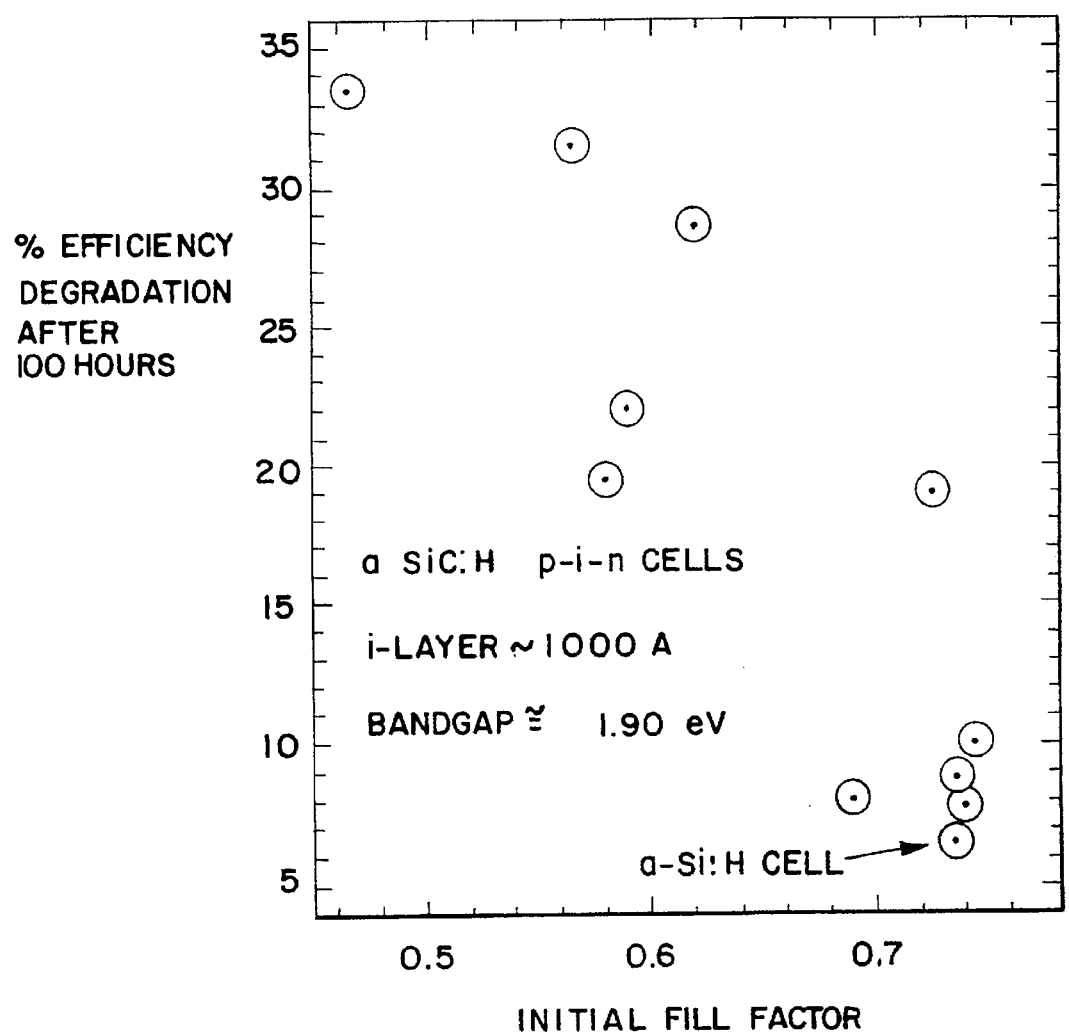
FIG. 17 is a graph of the efficiency degradation and initial fill factor.

FIG. 17 illustrates the relationship between the initial performance measured by the fill factor (FF) and rate of light-induced degradation measured by the loss of efficiency after 100 hours of AM1.5 illumination for hydrogen amorphous silicon carbon (a-SiC:H) solar cells fabricated under different deposition conditions. The i-layer bandgaps are about the same ($E_g \cong 1.90$ eV) for all of the cells. These data exhibit a trend in solar cells incorporating a-SiC:H i-layers. The better the initial performance, the better the stability.

From the above, it can be seen that the opto-electronic properties of glow-discharge hydrogenated amorphous silicon carbon (a-SiC:H) alloys deposited from silane (SiH$_4$)+ methane (CH$_4$) mixtures diluted in hydrogen at lower temperatures show significant improvements. These improvements have resulted in single-junction devices with higher initial performance due to higher open circuit voltages ($V_{oc}$) and higher fill factor (FF). These devices also show considerably greater stability against extended light-soaking.

Significance of Process

The significance of the invented glow-discharge process for hydrogenated amorphous silicon (a-Si:H) and its alloys, particularly wide-bandgap undoped hydrogenated amorphous silicon carbon (a-SiC:H) with a carbon concentration of less than 20%, and hydrogenated amorphous silicon (a-Si:H) with an optical bandgap of less than 1.85 eV, is two-fold. First, using the novel deposition procedure, we have been able to produce a-Si:H based solar cells with an open circuit voltage ($V_{oc}$) exceeding 1.00 volt and as high as 1.04 volts (a world record for this type of device). These solar cells have a high fill factor OFF) of greater than 0.70 using undoped a-SiC:H and subsequently a-Si:H without carbon alloying as the active i-layer. The product of $V_{oc}$ and FF is a world record. While an open circuit voltage ($V_{oc}$) of about 1.0V has been observed, in prior devices, the FF in those cases was typically poor (0.4–0.6).

The novel deposition process produces high quality, wide-bandgap a-SiC:H and a-Si:H that was previously unavailable for photovoltaic or other electronic/photoelectronic applications. The high quality wide-bandgap a-Si:H and a-SiC:H alloys can be used either as an i-layer itself or as a buffer layer (interface layer) at the p/i interfaces. The open circuit ($V_{oc}$) and the conversion efficiency of triple-junction solar cells can be increased by about 3–10% by using such high quality wide-bandgap i-layers or interface layers produced in accordance with this invention—at least for the first and second junctions for triple-junction devices. The benefits can also be obtained in single-junction or double-junction devices.

Importantly for practical applications and commercialization of a-Si:H based solar cells, the stability under continuous light exposure of a-SiC:H and a-Si:H solar cells deposited using the novel method has been surprisingly found to be excellent. The a-SiC:H solar cell fabricated by the inventive process has shown degradation of approximately 13 % after 1.700 hours of light soaking. This is a great improvement over previous results. Therefore, the inventive process makes it possible, for the first time, to incorporate wide-bandgap, undoped a-SiC:H in a-Si:H based solar cells, either as the bulk i-layer in the first junction of multi-junction cells, or as p/i buffer layers in a-Si:H and its alloy solar cells. The much improved stability of a-SiC:H and wide-bandgap a-Si:H solar cells is a most important attribute of the inventive deposition process.

It was unexpectedly and surprisingly found that excellent a-Si:H cells were achieved with high pressure radio frequency (RF) glow-discharge deposition. Typically in the conventional processing of RF or direct current (DC) glow-discharge a-Si:H and its alloys, the pressure is 0.1 to 0.5 Torr. Usually for DC glow-discharge, the gas pressure in the deposition chamber is not higher than about 3 Torr, because above this pressure it is difficult to sustain a stable plasma and to maintain good uniformity of film deposition. The deposition pressure of greater than 5.0 Torr (preferably about 10 Torr) for the inventive process is much higher than previously practiced, at any temperature or hydrogen ($H_2$) dilution ratio or power. The inventive process also features very high $H_2$-dilution ratios, e.g. up to 500:1, which previously has not been attempted to make amorphous silicon and its alloys. In contrast to prior art techniques, producing stable a-Si:H alloys at low temperatures is clearly an outstanding achievement.

In Tables 7 and 8 below are listed the ranges of RF and DC deposition conditions in the novel techniques for making a-Si:H and its alloys. The novel processes can be advantageously used to make wide-bandgap (bandgap>1.80 eV) a-Si:H alloys such as a-SiC:H and a-Si:H.

TABLE 7

| Deposition Parameter | Broad Range | Intermediate Range | Preferred Range |
| --- | --- | --- | --- |
| RF power density (mW/cm²) | 5–1000 | 20–150 | 40–80 |
| Substrate Temperature (°C.) | 20–250 | 80–180 | 120–150 |
| Deposition Pressure (Torr) | 0.2–50 | 0.5–20 | ~6–12 |
| $H_2$ (hydrogen) dilution ratio | 5–1000 | 20–400 | 40–200 |
| Total gas flow rate (sccm) | 10–10,000 | 50–4,000 | 1,000–2,500 |
| Deposition rate (Å/sec) | 0.1–20 | 0.3–4.0 | 0.5–2.5 |
| AC power frequency (MHz) | 0.1–10,000 | 2–500 | 10–100 |
| Electrode spacing (cm) | 0.2–10 | 0.5–4 | 1.2–2.5 |

The $H_2$-dilution ratio in Table 7 refers to the gas flow ratio of $H_2$ to other gases, such as silane ($SiH_4$) and methane ($CH_4$). For a-SiC:H deposition, $H_2$-dilution ratio of 20 means that for every part of the sum of $SiH_4$ and $CH_4$, there are 200 parts of $H_2$ flowing into the deposition system. This is also the gas volume ratio of $H_2$ to $SiH_4$ and $CH_4$. The total flow rate of all the gases will depend on the size of the deposition system and the pumping speed of the exhaust system. The above figures are particularly useful to fabricate 13 inch×12 inch (about 1,000cm²) solar modules. The selected RF power density, substrate temperature, deposition pressure and deposition rate depend on hydrogen dilution ratio. The RF glow discharge process can include: a high hydrogen dilution $$\left( \frac{H_2}{CH_4 + SiH_4} \right) > 80,$$

a high pressure (~9 Torr), and low temperature (~150° C.).

Thin films may be deposited on substrates placed in reactor systems in which a reactive plasma is produced by either a DC or RF excited glow discharge. A discharge is maintained by the creation of sufficient numbers of ions and electrons to balance those lost by various processes, the primary loss being charged particle recombination at the electrodes of the reactor system. There are two mechanisms available in RF glow discharges for the production of electrons sufficiently energetic to cause impact ionization of a neutral gas, whereas only one of these mechanisms is operative in DC glow discharges: (1) electrons may absorb energy from the RF field by elastic collisions and (2) secondary electrons may be emitted from reaction chamber surfaces which are bombarded by charged particles. These secondary electrons gain energy by acceleration through the so-called sheath potential near such surfaces. Only the latter mechanism, however, is operative in a DC glow discharge system.

RF glow discharge systems provide an excitation mechanism that enables the operation of the glow discharge not only over a wide range of pressures of the reactive gases, but also at relatively low electrical fields, and furthermore in relatively large volumes. Any one or all of these conditions make RF glow discharge systems useful and attractive in the preparation of large area thin film devices.

Reactive glow discharges from which such films may be deposited can be excited by RF by means of a coil wrapped externally about the reaction chamber, by capacitive plates that are disposed external to the reactor, as well as by internal electrodes. The plasma generated in such RF reactors with internal electrodes tends to be more nonuniform than for reactors in which the electrodes are placed external to the reactor. The plasma in such external electrode reactors tends to be confined to the walls near the elements.

A problem that exists in glow discharge plasma deposition systems, whether they be of the DC or RF excited type, is the damage that occurs to the deposited films caused by charged particle bombardment resulting from the glow discharge. This problem becomes particularly acute as the glow discharge region extends into the surface of the substrate upon which the films are being deposited. One method for attempting to reduce the harmful effects of glow discharge deposition is to position the substrate in a region remote enough from where the glow discharge by DC voltages is developed, that is, where a DC voltage is applied between the plate and cathode of the system. This is achieved by arranging the cathode with a planar screen electrode such as to pass the ionized particles developed by the glow discharge through the screen and onto a substrate.

A plasma deposition reactor apparatus capable of generating a radio frequency (RF) glow discharge can be provided with a perforated screen electrically connected to the anode of the reactor system and positioned between the anode and the cathode thereof. The screen confines the glow discharge to the region between the cathode and the screen. The substrate on which the film is to be deposited from a conducting reacting gas is positioned near the screen but not in the glow discharge region. Reactive gas can be introduced into the central portion of the reactor between the perforated screen and the cathode so that the kinetic energy of charged particles which may be deposited on the substrate is significantly reduced so as to minimize damage to the film on the substrate.

$M=0$, $SiF_4$ ($N=1$, $M=4$, Y=fluorine), $SiHF_3$($N=1$, $M=3$, Y=fluorine), $S_2H_2Cl_4$($N=2$, $M=4$, Y=chlorine), tetramethyl silane [$Si(CH_3)_4$], etc. When the alternative Si feedstocks are used, the optimal or preferred deposition conditions may have to be adjusted.

For hydrogenated amorphous silicon carbon (a-SiC:H) deposition, the alternative carbon feedstocks are numerous indeed. In general, most typical hydrocarbons or hydrogen-halogen-carbon compounds can be used, e.g. $CH_4$, $C_2H_2$, $C_2H_4$, $C_2H_6$, $CF_4$, $C_3H_8$, and $CDCl_3$. Other carbon feedstocks can be used which contain built-in carbon-silicon bonds, which can be expressed by the formula: $CH_N(SiH_3)_{4-N}$, where N is an integer in the range of 0 to 4, e.g. $CH_{N/3}SiH_3$ (methylsilane or silylmethane), $CH(SiH_3)_3$ (trisilymethane). The H in the second compound ($SiH_3$) in the above formula can be replaced by a halogen, e.g. $CH(SiF_3)_3$. When an alternative carbon feedstock is used in addition to or in place of methane ($CH_4$), the deposition parameters such as $H_2$-dilution ratio and power density can be adjusted accordingly. In the inventive process, deposition conditions of high pressure, low temperature, and high diluent concentrations are used to attain stable solar cells with high open circuit voltages ($V_{oc}$) and high fill factors (FF).

TABLE 8

| | DC Deposition Conditions | | | | | |
|---|---|---|---|---|---|---|
| Range | Deposition Temperature °C. | Deposition Pressure Torr | Dilution Ratio | Current Density A/cm² | Flows sccm | Thickness Å |
| | | | ($H_2$:$SiH_4$) | (actually current density) | $SiH_4$ | $H_2$ |
| Broad | Room temperature to 500 | 0–20 | 0.5:1–200:1 | 0.1–5 | <100 | <20000 | <10000 |
| Intermediate | 80–300 | .1T–10 | 1:1–50:1 | .03–0.5 | <100 | <5000 | 500–7500 |
| Preferred | 120–210 | .5T–2.5 | 5:1–20:1 | .05–0.1 | <50 | <1000 | 2500–4500 |

An important aspect in the deposition process is the combination of: high pressure, very high hydrogen ($H_2$) dilution ratio, low substrate temperature, and moderate excitation power density. Taken separately, each of the above parameters alone does not attain the desired results. For example, if only high $H_2$ dilution, e.g. >150:1, and low temperature, e.g. <160° C., is used with moderate power density, e.g. 100 mW/cm², without using high pressure, e.g. >8 Torr, the deposition would lead to a less desirable micro-crystalline silicon (μc-Si) i-layer instead of hydrogenated amorphous silicon (a-Si:H). The inventive deposition process is the first demonstration of successfully employing all of the above extreme parameters simultaneously.

TABLE 9

| Amorphous Silicon Carbon Solar Cells | |
|---|---|
| Device Structure | Deposition Condition |
| CTO/p/i/n/ZnO/Ag | Substrate temperature 100 to 180° C. |
| p-layer is a-SiC:H or a-SiO:H | $H_2$ dilution ratio > 100:1 (up to 500:1) |
| a-SiC:H i-layer thickness 900–1200 Å | Chamber pressure 8–20 Torr |
| ~7 mA/cm² as front cell in triple-junction cells | RF power density 40–100 mW/cm² |

Alternative Feedstocks

While silane and hydrogen are the preferred feedstocks for best results, there are many alternative feedstocks for undoped plasma-enhanced chemical vapor deposition (CVD) glow discharge a-Si:H and a-SiC:H alloys. The diluent hydrogen ($H_2$) can be replaced by deuterium (D), with the diluent gas being HD or $D_2$. The alterative feedstocks for silane ($SiH_4$), in addition to $SiH_4$ or instead of $SiH_4$, can be expressed by the following general formula: $Si_NH_{2N+2-M}Y_M$, where Si is silicon, H is hydrogen or deuterium, Y is a halogen, e.g. fluorine (F), chlorine (Cl), etc., N and M are positive integers under the constraint that $N \geq 1$ and $2N+2M \geq 0$. The examples of the above expression include silane ($SiH_4$), N=1, M=0, disilane ($Si_2H_6$), N=2, Hydrogenated amorphous silicon carbon solar cells, with or without p/i interface grading, can be fabricated as shown in Table 9.

Hydrogenated amorphous silicon single-junction solar cells having a cell structure of glass/textured CTO/p-SiC/i-SiC/n-Si (thick)/ZnO/Metal (Ag, Al, or NiCr), with amorphous doped layers, were fabricated in accordance with the above deposition conditions. These single-junction cells produced unexpectedly good results as shown in Tables 10 and 11. The high open circuit voltage ($V_{oc}$) and high fill factor (FF) indicate that the i-layer quality (a-SiC:H) is excellent even when the bandgap is >1.95 eV.

TABLE 10

Single-Junction Solar Cells with a-SiC:H i-layers

| Cell I.D. | i-thickness (Å) | $V_{oc}$ (volt) | FF | $J_{sc}$ (mA/cm²) | Efficiency ($V_{oc} \times FF \times J_{sc}$) | Comments |
|---|---|---|---|---|---|---|
| A2351-2 | ~700–800 | 0.97 | 0.75 | 7.20 | 5.24 | low carbon content |
| A2337-1 | ~900 | 1.00 | 0.74 | 7.40 | 5.48 | |
| A3007-3 | ~1000 | 1.00 | 0.74 | 8.30 | 6.14 | from codeposited cell |
| A2351-1 | 900–1000 | 1.01 | 0.74 | 6.90 | 5.16 | bandgap ~ 1.9 eV |
| A3051-1 | <800–900 | 1.02 | 0.72 | 6.20 | 4.55 | |
| A2357-2 | ~900 | 1.03 | 0.73 | 5.40 | 4.06 | thin cell |
| A2357-3 | ~1000 | 1.03/1.04 | 0.72/0.73 | 5.80 | 4.51 | high $V_{oc}$ & FF |
| A3008-3 | ~1000 | 1.04 | 0.70 | 5.40 | 3.93 | bandgap near 2.0 eV |

TABLE 11

Performance and Stability of High $V_{oc}$ Cells Made Under Process Deposition Conditions

| Cell I.D. | Type of i-layer | i-layer Thickness (Å) | Light Exposure (hours) | $V_{oc}$ (volt) | $J_{sc}$ (mA/cm²) | FF | Efficiency (%) | Comments |
|---|---|---|---|---|---|---|---|---|
| A3007-2 | a:Si:H w/o buffer | ~1000 | 0 | 0.96 | 8.7 | 0.724 | 6.06 | $T_a$ = 150° C., 8.5 torr |
| | | | 1000 | 0.954 | 8.4 | 0.707 (.69) | 5.66 | 7% degradation |
| A3008-1 | a:Si:H w/o buffer | 800–1000 | 0 | 0.983 | 7.1 | 0.723 | 5.05 | $T_a$ = 100° C., shunts! |
| | | | 960 | 0.971 | 6.8 | 0.68 | 4.49 | <11% degradation |
| A3007-3 | a:SiC:H cell | ~1000 | 0 | 0.991 | 8.3 | 0.712 | 5.86 | 150° C., 8.5 torr |
| | | | 1000 | 0.977 | 8.0 | 0.68 | 5.09 | 13% degradation |
| A3008-2 | a-Si:H with a-SiC:H buffer | 800–1000 | 0 | 1.001 | 6.8 | 0.743 | 5.06 | $T_a$ = 110° C., shunts! |
| | | | 960 | 0.979 | 6.5 | 0.691 | 4.4 | 13% degradation |
| A3011-3 | a-Si:H thick cell | 3300–3600 | 0 | 0.97 | 10.4 | 0.627 | 6.3(3) | $T_a$ = 110° C. |
| | | | 500 | 1.005 | 9.6(5) | 0.58 | 5.6(2) | 11–12% degradation |

Some examples of the deposition conditions which have led to greatly improved hydrogenareal amorphous silicon (a-Si:H)and hydrogenated amorphous silicon carbon (a-SiC:H) single-junction devices with high open circuit voltages ($V_{oc}$) and superb stability are shown in Table 12.

The solar modules in Table 12 have four i-layers, two a-Si:H and two a-SiC:H. The solar cells in Table 12 were produced by radio frequency (RF) 13.56 MHz glow-discharge deposition with an electrode spacing of 1.6 cm.

TABLE 12

Single-Junction Devices

| Deposition Parameter | A-Si:H A3007-2 | a-Si:H A3112-3 | a-SiC:H A3007-3 | a-SiC:H A2357-3 |
|---|---|---|---|---|
| Power (mW/cm²) | 40 | 63 | 40 | 45 |
| Subs.Temp. (°C.) | 150 | 140 | 150 | 145 |
| Pressure (Torr) | 8.5 | 20 | 8.5 | 9 |
| $H_2$ dilution ratio | 139:1 | 250:1 | 100:1 | 87:1 |
| Gas flow rates | 1250 $H_2$ + 9.0 $SiH_4$ | 2000 $H_2$ + 8.0 $SiH_4$ | 1300 $H_2$ + 9 $SiH_4$ + 4 $CH_4$ | 1300 $H_2$ + 7.5 $SiH_4$ + 7.5 $CH_4$ |
| Dep. rate (Å/sec) | ~0.7 | ~0.45 | ~0.6 | ~0.5 |
| Thickness (Å) | ~1,000 | ~1400 | ~1000–1200 | ~900–1000 |
| $V_{oc}$ (volt) | 0.96 | 0.97 | 1.00 (0.998) | 1.04 |
| FF | 0.724 | 0.74 | 0.74 | 0.72 |
| $J_{sc}$ (mA/cm²) | 8.7 | 9.2 | 8.3 | 5.9 |
| Comments | standard conditions | higher pressure & higher $H_2$ | most stable a-SiC:H cell | highest $V_{oc}$ observed |

The degradation for A2357-3 in Table 12 is about 25% after 1000 hours of light soaking. Generally, lower substrate temperature leads to higher open circuit voltages ($V_{oc}$). As long as the hydrogen ($H_2$) dilution is sufficiently high, the stability of low-temperature cells seems to be very good.

It can be seen from the above that excellent quality amorphous silicon solar cells can be produced by amorphous silicon alloy plasma chemical vapor deposition (CVD) under conditions of high pressure, high hydrogen ($H_2$)-dilution, and low temperatures. The inventive process produces plasma CVD deposition (glow-discharge) of high quality, stable electronic materials, e.g. a-Si:H and its alloys, under the combined conditions of medium to high pressure (>4 Torr, e.g. at 10 Torr), high $H_2$-dilution of the feedstocks (e.g. >50:1), and relatively low temperature (e.g. room temperature to 150° C. or 200° C.). This unique combination of parameters has not been previously successfully implemented.

The inventive process provides fabrication of wide-bandgap amorphous hydrogenated Si-C alloys (a-SiC:H) of high electronic quality for device (solar cell) applications with higher open circuit voltages ($V_{oc}$), better fill-factor (FF), slower degradation under light illumination and higher long-term efficiency. Previously, it was not possible to make a-SiC:H or a-SiH solar cells with high open circuit voltages ($V_{oc}$) >1.00 volt with a good fill factor (>0.70)by the glow-discharge method.

The inventive deposition process may be applied to a-Si:H or other materials deposition using the plasma enhanced CVD. This invention covers the direct and remote plasma-CVD deposition of any material under conditions similar to those described above. Deposition parameters such as power density or electrical bias may be varied, if desired. The inventive process is particularly useful to produce a-Si:H and a-SiC:H films, cells and solar modules. Excellent transport properties are obtained with the inventive process. The presence of significant amounts of carbon radicals in amorphous silicon carbon can prevent the microcrystallite formation even under the condition of very high $H_2$-dilution which otherwise can lead to micro-crystaline silicon (μc-Si). Increased hydrogen dilution can improve a-SiC:H wide-gap material. The process also provides better surface coverage by the hydrogen during growth, so as to attain higher surface mobility of growth precursors and a better chance of hydrogen compensation of defects. The process may also provide: better micro-structure, more uniform growth and less ion bombardments at the growth surface. The combination of high $H_2$-dilution, low temperature and high pressure can also produce more stable a-Si alloys by saturating H-radicals at the film growth surface thereby avoiding or reducing H-reconfiguration after deposition near room temperature. Desirably, high pressure a-SiC films adhere well to substrates unlike conventional films fabricated at lower pressures and low temperatures. This suggests less stress in the film, better film quality, and stability.

The process conditions can include higher pressure (e.g. >10 Torr) and higher $H_2$-dilution (e.g. >100:1) at relatively low temperatures. The pressure may be limited by the ability to sustain a stable plasma. The discharge (rf) power density can also be different than under normal deposition conditions (200°–300° C., moderate $H_2$-dilution, at low pressures, i.e. 0.2 to 1.5 Torr). Higher power may be necessary to sustain the plasma at higher pressures.

Dependence of Solar Cell Stability on Substrate Temperature and Hydrogen Dilution It has been discovered that deposition by the inventive process at lower substrate temperatures (<250° C.) significantly improves the open circuit voltage ($V_{oc}$) of the solar cell. Furthermore, when hydrogen ($H_2$-dilution is used in combination with the lower substrate temperature, the stability of the solar cell is also significantly improved. In contrast, when a lower substrate temperature is used without $H_2$-dilution, the device stability usually deteriorates.

The stability of both SiC and Si cells has been dramatically improved by means of the new low temperature $H_2$-diluted deposition. For cells made at 260° C. without $H_2$-dilution, the most important determinant of degradation rate is the i-layer thickness. The second most important determinant was the nature of the p-i interface layer. I-layer deposition temperature and deposition rate strongly affect the degradation rate however.

Tests

Single-junction a-Si:H p-i-n solar cells were made at several different temperatures with various levels of hydrogen ($H_2$) dilution. The stability of those devices were evaluated. The i-layer thickness in the devices which can also affect the stability was kept roughly constant (from 1700 Å to 2200 Å) for all devices used in the tests.

Table 13 lists the photovoltaic parameters for selected representative devices used in these tests before and after an extended period of light soaking (519 hours at 100 mW/cm² intensity).

TABLE 13

Performance of Selected Low Temperature, High $H_2$-Dilution Si Cells

| Cell # | Sub. Temp. | $H_2$-dil. | Thickness | Deg. hours | $V_{oc}$ (V) | $J_{sc}$ (mA/cm²) | FF (%) | Eff. (%) |
|---|---|---|---|---|---|---|---|---|
| D-30607-1 | 210° C. | 10:1 | 1900Å | 0 | 0.886 | 13.40 | 70.7 | 8.39 |
|  |  |  |  | 519 | 0.887 | 13.05 | 64.7 | 7.49 (89.3%*) |
| D30603-4 | 150° C. | 10:1 | 2200Å | 0 | 0.945 | 12.58 | 73.6 | 8.75 |
|  |  |  |  | 519 | 0.938 | 12.14 | 65.4 | 7.45 (85.1%*) |
| D-30604-3 | 150° C. | 20:1 | 2000Å | 0 | 0.952 | 12.15 | 71.5 | 8.28 |
|  |  |  |  | 519 | 0.973 | 11.49 | 66.1 | 7.39 (89.3%*) |
| D-30602-2 | 150° C. | 30:1 | 1800Å | 0 | 0.951 | 10.70 | 68.9 | 7.02 |
|  |  |  |  | 519 | 0.983 | 10.24 | 64.5 | 6.49 (92.5%*) |
| D-30603-2 | 150° C. | 50:1 | 1700Å | 0 | 0.956 | 10.33 | 72.0 | 7.1 |
|  |  |  |  | 519 | 0.986 | 9.99 | 66.2 | 6.52 (91.7%*) |

*Normalized cell efficiencies at the end of the light soaking period.

A number of trends with respect to the stability of the devices can be found from Table 13. Stability can be defined as the normalized cell efficiency after prolonged light exposure. First, the device stability improves with increasing hydrogen ($H_2$) dilution in depositing a-Si:H when the $H_2$-dilution ratio is below a certain threshold. Above this threshold value, the stability becomes insensitive to further increase in $H_2$-dilution. This threshold, for example, is about 10:1 at 210° C. and about 30:1 at 150° C.

Figure 18:
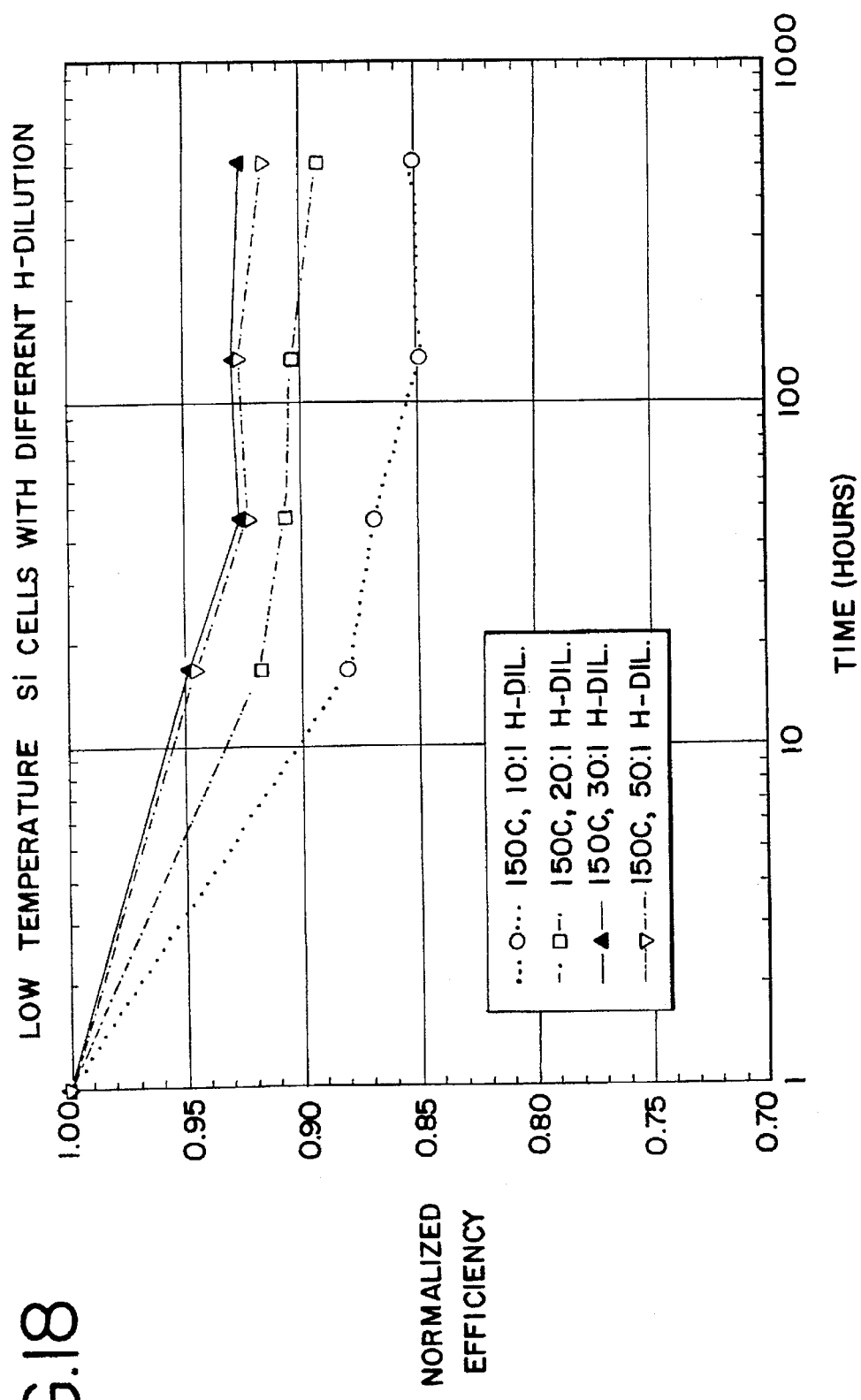
FIG. 18 is a graph of the degradation of normalized efficiency for various hydrogen dilutions.

FIG. 18 illustrates the above trend by plotting the normalized cell efficiencies as a function of light exposure time on a logarithmic scale for the series of devices made at 150° C. with varying degrees of hydrogen ($H_2$) dilution. It is also apparent in FIG. 18, that light induced degradation saturates much sooner in devices made with $H_2$-dilution (~100 hours) than those made without $H_2$-dilution (>1000 hours).

Figure 19:
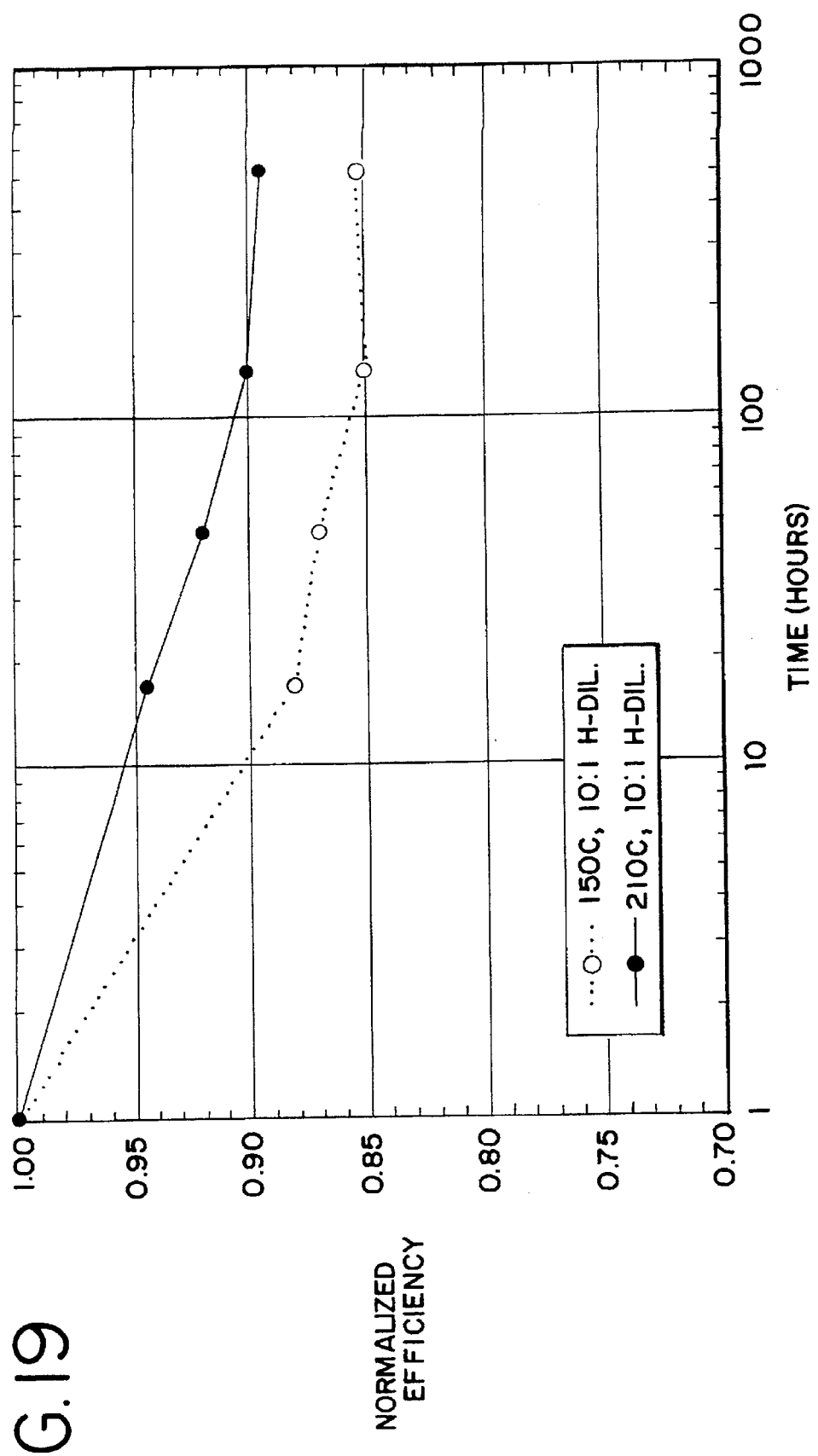
FIG. 19 is a graph of the degradation of normalized efficiency at different deposition temperatures.

The second trend one can find from these tests is that at a given $H_2$-dilution ratio, the device stability deteriorates with decreasing substrate temperature. This is seen clearly from FIG. 19 where normalized efficiencies of two cells which were made at 210° C. and 150° C., respectively, but at the same $H_2$-dilution ratio (10:1). The normalized efficiencies in FIG. 19 are plotted as a function of log exposure time.

By combining the above two trends, we can conclude that in order to optimize the open circuit voltage ($V_{oc}$) and the stability of the device at the same time, a sufficiently low substrate temperature together with a sufficiently high $H_2$-dilution ratio should be used to deposit a-Si:H based solar cells. The ranges for temperature and $H_2$-dilution ratio where the above findings do apply should be a temperature ranging from 80° C. to 280° C. and hydrogen ($H_2$) dilution of 1:1 to 100:1.

Improvements

There are many important improvements in single and multi-junction cells that have resulted from the use of low temperature, $H_2$-diluted, silicon depositions. As shown in FIG. 19, the degradation of the cells produced by the inventive process has a different functional dependence on time. After long periods of exposure to light, the efficiency changes in a sublinear fashion when plotted against the log of time. Furthermore, the dependence of rate of degradation on i-layer thickness is much reduced, so that for thicknesses greater than about 3000 Å, the rate of degradation has a much reduced dependence on i-layer thickness. Increasing dilution improves stability, though not linearly. Lower growth rate can lead to better stability. As deposition temperature is lowered stability gets worse, all else being held constant. However, if as temperature decreases, the degree of dilution increases, then it seems that the stability can be retained.

A comparison of the degradation rate of single and multi-junction cells produced is by plasma CVD deposition, with and without hydrogen dilution, are estimated in Table 14.

TABLE 14

Degradation Rate of Single and Multi-Junction Cells

| Type | $i_1/(i_2)$ thicknesses | loss in 1000 hours | | |
|---|---|---|---|---|
| | | $i_1$ | $i_2$ | overall |
| Si single (4000Å) high temp, no $H_2$ dilution | 4000Å | 40% | — | 40% |
| Si single (6000Å), high temp, no $H_2$ dilution | 6000Å | 60% | — | 60% |
| Si single (4000Å), low temp, $H_2$ dilution | 4000Å | 27% | — | 27% |
| Si single (6000Å), low temp, $H_2$ dilution | 6000Å | 35% | — | 35% |
| Si/Si tandem (700Å/3300Å), high temp, no $H_2$ dilution | 700Å/3300Å | 7% | 33% | 20% |
| Si/Si tandem (800Å/5200Å), high temp, no $H_2$ dilution | 800Å/5200Å | 8% | 52% | 30% |
| Si/Si tandem (700Å/3300Å), low temp, $H_2$ dilution | 700Å/3300Å | 7% | 23% | 15% |
| Si/Si tandem (800Å/5200Å), low temp, $H_2$ dilution | 800Å/5200Å | 8% | 33% | 20% |

Amorphous Silicon Germanium

Device improvements with the inventive deposition process include optimization of silane/hydrogen ratios in glow-discharge deposition, incorporation of germanium in the middle and bottom i-layers, and thinner i-layers for stability. The inventive deposition process produced a 900 cm² module with an initial conversion efficiency of 11.35%. After 1000 hours of light soaking, the solar module stabilized at an efficiency of approximately 9%.

Although embodiments of this invention have been shown and described, it is to be understood that various modifications and substitutions, as well as a rearrangement of parts, components, and process steps can be made by those skilled in the art without departing from the novel spirit and scope of this invention.

What is claimed is:

1. A process comprising the steps of:

fabricating semiconductor devices comprising a layer of amorphous silicon supported on a substrate, by plasma enhanced chemical vapor deposition of said amorphous silicon layer under the following conditions:

a substrate temperature ranging from 80° C. to 220° C.;

a pressure ranging from 2 to 50 Torr;

a plasma discharge power density ranging from 20 to 150 mW/cm²;

a feedstock gas highly diluted with a diluent gas selected from the group consisting of hydrogen, deuterium, and combinations thereof;

said feedstock gas comprising at least one member of the group consisting of: silane, disilane, tetramethyl silane, $SiF_4$, $SiHF_3$, $SiH_2Cl_4$, and other gases having the general formula $Si_NH_{2N+2-M}Y_M$ wherein;

Si=silicon

H=hydrogen or deuterium

Y=a halogen

N=positive integer $\geq 1$

M=positive integer; and 2N+2−M$\geq$0; and the dilution ratio of said diluent gas to said feedstock gas ranging from about 20:1 to about 400:1.

2. A process in accordance with claim 1 wherein:

said plasma enhanced chemical vapor deposition comprises radio frequency glow discharge, said pressure ranges from about 6 Torr to about 12 Torr, said substrate temperature ranges from 120° C. to 150° C., said discharge power density ranges from 40 to 80 mW/cm$^2$; and said dilution ratio ranges from 40:1 to 200:1.

3. A process in accordance with claim 1 wherein:

said devices comprise single-junction solar cells having an I-layer comprising said amorphous silicon layer, having a fill factor greater than 0.64 and an open circuit voltage greater than 0.9V;

said diluent gas comprises hydrogen;

said feedstock gas comprises silane; and said substrate is selected from the group consisting of glass and stainless steel.

4. A process in accordance with claim 3 wherein:

said substrate comprises glass; and said single junction solar devices have a fill factor greater than 0.7 and an open circuit voltage greater than 1.0V.

5. A process comprising the steps of:

fabricating semiconductor devices comprising a layer of amorphous silicon supported on, a substrate, by plasma enhanced chemical vapor deposition of said amorphous silicon layer under the following conditions:

a substrate temperature ranging from 20° C. to 300° C.;

a plasma discharge current density ranging from 0.01 to 5 A/cm$^2$;

a feedstock gas highly diluted with a diluent gas selected from the group consisting of hydrogen, deuterium, and combinations thereof;

said feedstock gas comprising at least one member of the group consisting of: silane, disilane, tetramethyl silane, SiF$_4$, SiHF$_3$, SiH$_2$Cl$_4$, and other gases having the general formula Si$_N$H$_{2N+2-M}$Y$_M$ wherein;

Si=silicon

H=hydrogen or deuterium

Y=a halogen

N=positive integer $\geq 1$

M=positive integer; and 2N+2−M$\geq 0$ the dilution ratio of said diluent gas to said feedstock gas ranging from about 5:1 to about 200:1; and a pressure greater than 1.0 Torr to about 10 Torr.

6. A process in accordance with claim 5 wherein:

said devices comprise single-junction solar cells having an I-layer comprising said amorphous silicon, a fill factor greater than 0.64, and an open circuit voltage greater than 0.9;

said diluent gas comprises hydrogen;

said feedstock gas comprises silane; and said substrate is selected from the group consisting of glass and stainless steel.

7. A process in accordance with claim 6 wherein:

said plasma enhanced chemical deposition occurs by DC glow discharge at a substrate temperature ranging from about 80°–210° C.;

a pressure greater than about 5 Torr to about 10 Torr;

a dilution ratio ranging from about 10:1 to about 50:1;

a current density ranging from about 0.03 to about 0.5 A/cm$^2$; and said substrate comprises glass.

* * * * *

UNITED STATES PATENT AND TRADEMARK OFFICE
CERTIFICATE OF CORRECTION

PATENT NO. : 5,646,050
DATED : July 8, 1997
INVENTOR(S) : Yaun Min Li, Murray S. Bennett, Liyou Yang It is certified that error appears in the above-identified patent and that said Letters Patent is hereby corrected as shown below:

| Col. | Line | |
|---|---|---|
| 2 | 49 | reads "improvements of the transparent conductor" should read --improvements on the transparent conductor-- |
| 2 | 51 | reads "layer, by incorporating higher bandgap i-layers" should read --layer or by incorporating higher bandgap i-layers-- |
| 3 | 49 | reads "with a small amount of hydrogen dilution" should read --with a small concentration of hydrogen dilution-- |
| 6 | 28 | reads "an active intrinsic Mayer, an i-n interface" should read --an active intrinsic i-layer, an i-n interface-- |

UNITED STATES PATENT AND TRADEMARK OFFICE
CERTIFICATE OF CORRECTION

PATENT NO. : 5,646,050
DATED : July 8, 1997
INVENTOR(S) : Yaun Min Li, Murray S. Bennett, Liyou Yang It is certified that error appears in the above-identified patent and that said Letters Patent is hereby corrected as shown below:

| | | |
|---|---|---|
| 6 | 55 | reads "variation of are bipolar (hole) diffusion length"<br>should read --variation of ambipolar (hole) diffusion length-- |
| 6 | 63 | reads "a graph of are bipolar (hole) diffusion"<br>should read --a graph of ambipolar (hole) diffusion-- |
| 7 | 28 | reads "The thickness of the Mayer"<br>should read --The thickness of the i-layer-- |
| 10 | 56 | reads "in the upper fight hand"<br>should read --in the upper right hand-- |
| 11 | 20 | reads "where no current is drown"<br>should read --where no current is drawn-- |

UNITED STATES PATENT AND TRADEMARK OFFICE
CERTIFICATE OF CORRECTION

PATENT NO. : 5,646,050
DATED : July 8, 1997
INVENTOR(S) : Yaun-Min Li, Murray S. Bennett, Liyou Yang It is certified that error appears in the above-identified patent and that said Letters Patent is hereby corrected as shown below:

| Col. | Line | |
|---|---|---|
| 11 | 45 | reads "depositing the Mayer" should read --depositing the i-layer-- |
| 14 | 3 | reads "the are bipolar diffusion length" should read --the ambipolar diffusion length-- |
| 14 | 10 | reads "the infrared CIR) spectra" should read --the infrared (IR) spectra-- |
| 15 | 54 | reads "steady state are bipolar" should read --steady state ambipolar-- |
| 16 | 16 | reads "derived Urbaeh energy" should read --derived Urbach energy-- |

UNITED STATES PATENT AND TRADEMARK OFFICE
CERTIFICATE OF CORRECTION

PATENT NO. : 5,646,050
DATED : July 8, 1997
INVENTOR(S) : Yaun-Min Li, Murray S. Bennett, Liyou Yang Page 4 of 5

It is certified that error appears in the above-identified patent and that said Letters Patent is hereby corrected as shown below:

| Col. | Line | |
|---|---|---|
| 16 | 42 | reads "In file bandgap region" should read --In the bandgap region-- |
| 18 | 45 | reads "against extended fight-soaking" should read --against extended light soaking-- |
| 18 | 58 | reads "a high fill factor OFF) of greater than 0.70" should read --a high fill factor (FF) of greater than 0.70-- |
| 21 | 61 | reads "gas being HD or D2 should read --gas being HD or $D_2$-- |
| 22 | 31 | reads "0 to 4, e.g. $CH_{N3}SiH_3$" should read -- 0 to 4, e.g. $CH_3SiH_3$-- |
| 23 | 41 | reads "greatly improved hydrogenareal amorphous silicon" should read --greatly improved hydrogenated amorphous silicon'-- |

UNITED STATES PATENT AND TRADEMARK OFFICE
CERTIFICATE OF CORRECTION

PATENT NO.  : 5,646,050
DATED       : July 8, 1997
INVENTOR(S) : Yaun-Min Li, Murray S. Bennet, Liyou Yang It is certified that error appears in the above-identified patent and that said Letters Patent is hereby corrected as shown below:

| Col. | Line | |
|------|------|---|
| 26 | 59 | reads "7.1" (Eff. (%))<br>should read --7.11-- |
| 30 | 12 | reads "greater than 1.0 Torr"<br>should read --greater than 0.1 Torr"-- |

Signed and Sealed this

Twenty-fourth Day of November, 1998

Attest:

BRUCE LEHMAN

*Attesting Officer*     *Commissioner of Patents and Trademarks*